US012563660B2

(12) United States Patent
Kim et al.

(10) Patent No.: US 12,563,660 B2
(45) Date of Patent: Feb. 24, 2026

(54) CIRCUIT BOARD AND ELECTRONIC DEVICE COMPRISING SAME

(71) Applicant: Samsung Electronics Co., Ltd., Suwon-si (KR)

(72) Inventors: Byeongkeol Kim, Suwon-si (KR); Eunseok Hong, Suwon-si (KR); Youngsun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 307 days.

(21) Appl. No.: 18/348,003

(22) Filed: Jul. 6, 2023

(65) Prior Publication Data

US 2023/0363082 A1     Nov. 9, 2023

Related U.S. Application Data

(63) Continuation of application No. PCT/KR2022/000076, filed on Jan. 4, 2022.

(30) Foreign Application Priority Data

Jan. 6, 2021     (KR) ........................ 10-2021-0001487

(51) Int. Cl.
H05K 1/02          (2006.01)
H04B 1/00          (2006.01)
          (Continued)

(52) U.S. Cl.
CPC ......... H05K 1/0219 (2013.01); H04B 1/0053 (2013.01); H04M 1/0277 (2013.01);
          (Continued)

(58) Field of Classification Search
CPC ...... H05K 1/0219; H05K 1/028; H05K 1/118; H05K 3/28; H05K 3/429;
          (Continued)

(56) References Cited

U.S. PATENT DOCUMENTS 8,071,883 B2 * 12/2011 Takahashi ............ H05K 3/4691
                                                    174/254
8,569,630 B2    10/2013 Naganuma et al.
                    (Continued)

FOREIGN PATENT DOCUMENTS

JP          2007-129087 A     5/2007
KR     10-2008-0012527 A      2/2008
                    (Continued)

OTHER PUBLICATIONS

Translation of KR20100079336A (Year: 2010).*
                    (Continued)

*Primary Examiner* — George Eng
(74) *Attorney, Agent, or Firm* — Jefferson IP Law, LLP

(57)          ABSTRACT

An electronic device is provided. The electronic device includes a housing including a first housing part and a second housing part movable with respect to the first housing part, and a circuit board positioned in the housing and including a first part bent in response to movement of the second housing part and a second part extending from the first part and more rigid than the first part, wherein the circuit board may comprise a flexible non-conductive film extending from the first part to the second part, a laminate structure including at least one conductive pattern positioned on the flexible non-conductive film, a coverlay extending from the first part to the second part, overlapping the laminate structure, and including an electromagnetic shielding material, and at least one conductive via positioned at the second part and electrically connecting the at least one conductive pattern and the coverlay.

18 Claims, 22 Drawing Sheets

(51) Int. Cl.

| | |
|---|---|
| *H04M 1/02* | (2006.01) |
| *H05K 1/11* | (2006.01) |
| *H05K 3/28* | (2006.01) |
| *H05K 3/42* | (2006.01) |

(52) U.S. Cl.
CPC ............. *H05K 1/028* (2013.01); *H05K 1/118* (2013.01); *H05K 3/28* (2013.01); *H05K 3/429* (2013.01); *H05K 2201/09636* (2013.01)

(58) Field of Classification Search
CPC ....... H05K 2201/09636; H05K 1/0243; H05K 1/115; H05K 2201/0715; H05K 2201/0959; H05K 2201/096; H05K 2201/10098; H05K 2203/107; H05K 1/0218; H05K 3/4691; H05K 1/147; H05K 3/281; H04B 1/0053; H04M 1/0277; H04M 1/0214; H04M 1/0235; H04M 1/026; G06F 1/1616; G06F 1/1624; G06F 1/1652; H01P 3/085; H01Q 1/243; H01Q 1/38
See application file for complete search history.

(56) References Cited

U.S. PATENT DOCUMENTS

| | | | |
|---|---|---|---|
| 8,631,567 | B2 | 1/2014 | Lee et al. |
| 10,827,607 | B2 | 11/2020 | Park et al. |
| 11,229,118 | B2 | 1/2022 | Park |
| 11,943,888 | B2 | 3/2024 | Hong |

| | | | | |
|---|---|---|---|---|
| 2008/0093118 | A1 | 4/2008 | Takahashi et al. | |
| 2010/0147569 | A1 | 6/2010 | Honjo et al. | |
| 2012/0047727 | A1 | 3/2012 | Takahashi | |
| 2020/0060020 | A1 | 2/2020 | Park et al. | |
| 2021/0135492 | A1 | 5/2021 | Kim et al. | |
| 2021/0195739 | A1* | 6/2021 | Bae ...................... | H05K 1/0224 |
| 2023/0189430 | A1* | 6/2023 | Park ...................... | H05K 1/0219 |
| | | | | 174/250 |
| 2025/0081360 | A1* | 3/2025 | Lee ...................... | H05K 1/0218 |

FOREIGN PATENT DOCUMENTS

| | | | |
|---|---|---|---|
| KR | | 10-0907353 B1 | 7/2009 |
| KR | | 10-2010-0079336 A | 7/2010 |
| KR | | 10-2011-0086493 A | 7/2011 |
| KR | | 10-2016-0124344 A | 10/2016 |
| KR | | 10-1917759 B1 | 11/2018 |
| KR | | 10-1946989 B1 | 2/2019 |
| KR | | 10-2019-0115888 A | 10/2019 |
| KR | | 10-2020-0048238 A | 5/2020 |
| KR | | 10-2295108 B1 | 8/2021 |
| KR | | 10-2420788 B1 | 7/2022 |

OTHER PUBLICATIONS

Translation of KR20190115888A (Year: 2019).*
International Search Report dated Apr. 11, 2022, issued in an International Application No. PCT/KR2022/000076.
Korean Office Action dated Mar. 20, 2025, issued in a Korean Patent Application No. 10 2021 0001487.
Extended European Search Report dated Jul. 19, 2024, issued in European Application No. 22736805.7-1211.

* cited by examiner

CIRCUIT BOARD AND ELECTRONIC DEVICE COMPRISING SAME

CROSS-REFERENCE TO RELATED APPLICATION(S)

This application is a continuation application, claiming priority under § 365(c), of an International application No. PCT/KR2022/000076, filed on Jan. 4, 2022, which is based on and claims the benefit of a Korean patent application number 10-2021-0001487, filed on Jan. 6, 2021, in the Korean Intellectual Property Office, the disclosure of which is incorporated by reference herein in its entirety.

BACKGROUND

1. Field

The disclosure relates to a circuit board and an electronic device including the same.

2. Description of Related Art

In line with development of digital technologies, electronic devices have been provided in various types, such as a smart phone, a tablet personal computer, or a personal digital assistant (PDA). Electronic devices have also been developed such that users can wear the same, thereby improving portability and user accessibility. In line with development of wireless communication technologies, electronic devices (for example, electronic devices for communication) have been widely used in daily life, thereby increasing content use. Rapidly increasing data traffic is followed by increased frequency demands, and technologies have been gradually developed to use high-frequency bands or ultra-high-frequency bands (for example, millimeter wave (mmWave)), through which data can be transferred more easily, for mobile communication purposes. An electronic device may include a circuit board (for example, a flexible printed circuit board) as an electric path through which electric elements are electrically connected. The circuit board may have an electromagnetic shielding structure positioned thereon to reduce the electromagnetic influence (for example, electro-magnetic interference (EMI)) on signals transferred through the circuit board. Signals may be more sensitive to the influence of electromagnetic noise in ultra-high-frequency bands, and electromagnetic shielding structures for securing the reliability of signal transfer (for example, signal integrity) have become indispensable to circuit boards utilized as electric paths.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electromagnetic shielding structure includes a shield film attached to one surface of a circuit board, for example. The circuit board needs to be implemented to include a structure for electric conductance with the shield film in response to the shield film attached thereto, and thus is hardly efficient in terms of manufacturing processes and manufacturing costs. In addition, when the circuit board is applied to an electronic device that requires bending characteristics, such as a foldable electronic device, it is difficult to prevent the circuit board from fracturing during bending if a shield film is attached thereto, and such a fracture consequently degrades the electromagnetic shielding performance.

Another aspect of the disclosure is to provide a circuit board including an electromagnetic shielding structure capable of reducing manufacturing processes and manufacturing costs while securing bending characteristics so as to reduce fracturing during bending, and an electronic device including the same.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first housing part and a second housing part configured to be movable relative to the first housing part, and a circuit board which is positioned in the housing and includes a first portion bent in response to a movement of the second housing part, and a second portion which extends from the first portion and is more rigid than the first portion, wherein the circuit board includes a lamination structure including a flexible non-conductive film extending from the first portion to the second portion, and at least one conductive pattern positioned on the flexible non-conductive film, a coverlay extending from the first portion to the second portion and including an electromagnetic shielding material overlapped with the lamination structure, and at least one conductive via positioned in the second portion and configured to electrically connect the at least one conductive pattern and the coverlay.

In accordance with another aspect of the disclosure, a circuit board is provided. The circuit board includes a first portion, a second portion which extends from the first portion and is more rigid than the first portion, a lamination structure including a flexible non-conductive film extending from the first portion to the second portion and at least one conductive pattern positioned on the flexible non-conductive film, a coverlay extending from the first portion into the second portion and including an electromagnetic shielding material overlapped with the lamination structure, and at least one conductive via positioned in the second portion and configured to electrically connect the at least one conductive pattern and the coverlay.

A circuit board according to an embodiment of the disclosure includes an electromagnetic shielding structure capable of reducing manufacturing processes and manufacturing costs while securing bending characteristics so as to reduce fracturing during bending, and thus be applied to an electronic device requiring bending characteristics, such as a foldable electronic device, thereby not only improving the reliability regarding signal transfer and durability, but also contributing to slimness.

Other aspects, advantageous, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 7 illustrates a cross-sectional structure of a part of a circuit board taken along line A-A' in FIG. 6 according to an embodiment of the disclosure;

FIG. 13 illustrates a cross-sectional structure of a part of a circuit board taken along line A-A' in FIG. 6 according to an embodiment of the disclosure;

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
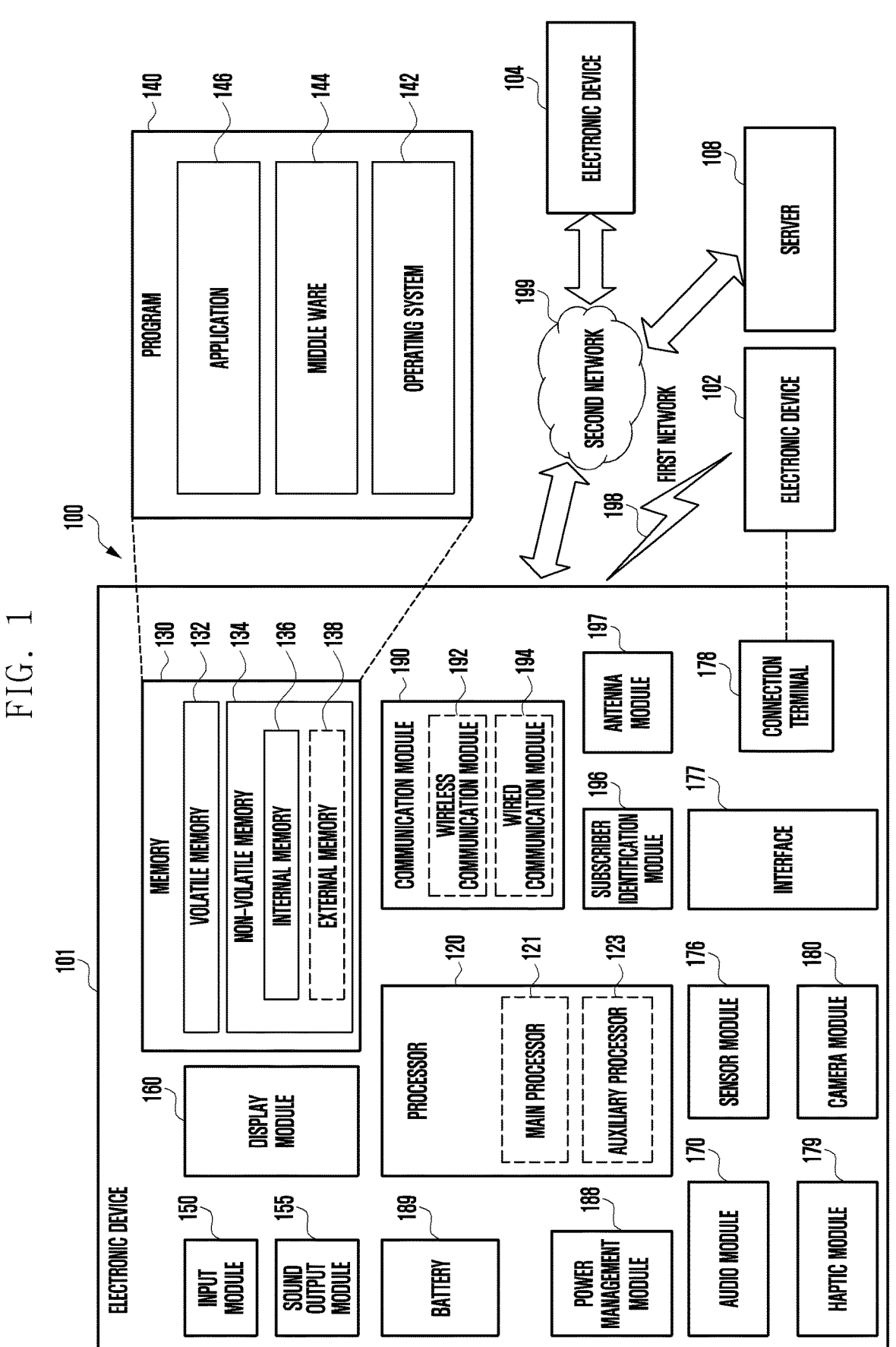
FIG. 1 is a block diagram of an electronic device in a network environment according to an embodiment of the disclosure.

FIG. 1 is a block diagram of an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). The electronic device 101 may communicate with the external electronic device 104 via the server 108. The electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, and/or an antenna module 197. In some embodiments of the disclosure, at least one (e.g., the connection terminal 178) of the components may be omitted from the electronic device 101, or one or more other components may be added in the electronic device 101. In some embodiments of the disclosure, some of the components may be implemented as single integrated circuitry. For example, the sensor module 176, the camera module 180, or the antenna module 197 may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in a volatile memory 132, process the command or the data stored in the volatile memory 132, and store resulting data in a non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, the auxiliary processor 123 (e.g., a neural network processing device) may include a hardware structure specified for processing an artificial intelligence model. The artificial intelligence model may be created through machine learning. Such learning may be performed, for example, in the electronic device 101 itself on which the artificial intelligence model is performed, or may be performed through a separate server (e.g., the server 108). The learning algorithms may include, for example, supervised learning, unsupervised learning, semi-supervised learning, or reinforcement learning, but is not limited thereto. The artificial intelligence model may include a plurality of artificial neural network layers. The artificial neural network may be any of a deep neural network (DNN), a convolutional neural network (CNN), a recurrent neural network (RNN), a restricted Boltzmann machine (RBM), a deep belief network (DBN), a bidirectional recurrent DNN (BRDNN), a deep Q-network, or a combination of two or more of the above-mentioned networks, but is not limited the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The data may include, for example, software (e.g., the program 140) and input data or output data for a command related thereto. The memory 130 may include the volatile memory 132 and/or the non-volatile memory 134.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., the external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. The interface 177 may include, for example, a high-definition multimedia interface (HDMI), a universal serial bus (USB) interface, a secure digital (SD) card interface, and/or an audio interface.

The connecting terminal 178 may include a connector via which the electronic device 101 may be physically connected with the external electronic device (e.g., the external electronic device 102). The connecting terminal 178 may include, for example, an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, ISPs, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or IR data association (IrDA)) or the second network 199 (e.g., a long-range communication network, such as a legacy cellular network, a 5$^{th}$ generation (5G) network, a next generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a 4th generation (4G) network, and next-generation communication technology, e.g., new radio (NR) access technology. The NR access technology may support high-speed transmission of high-capacity data (i.e., enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) to achieve, for example, a high data transmission rate. The wireless communication module 192 may support various technologies for securing performance in a high-frequency band, such as beamforming, massive multiple-input and multiple-output (MIMO), full-dimensional MIMO (FD-MIMO), array antenna, analog beam-forming, or large-scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate for implementing eMBB (e.g., 20 gigabits per second (Gbps) or more), loss coverage for implementing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a PCB, an RFIC that is disposed on or adjacent to a first surface (e.g., the bottom surface) of the PCB and is capable of supporting a predetermined high-frequency band (e.g., a mmWave band), and a plurality of antennas (e.g., array antennas) that is disposed on or adjacent to a second surface (e.g., the top surface or the side surface) of the PCB and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the external electronic devices 102 or 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide an ultra-low delay service using, for example, distributed computing or MEC. In another embodiment of the disclosure, the external electronic device 104 may include an internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on 5G communication technology or IoT-related technology.

An electronic device according to an embodiment of the disclosure may be one of various types of electronic devices. The electronic devices may include a portable communication device (e.g., a smartphone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "$1^{st}$" and "$2^{nd}$," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., PLAY-STORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
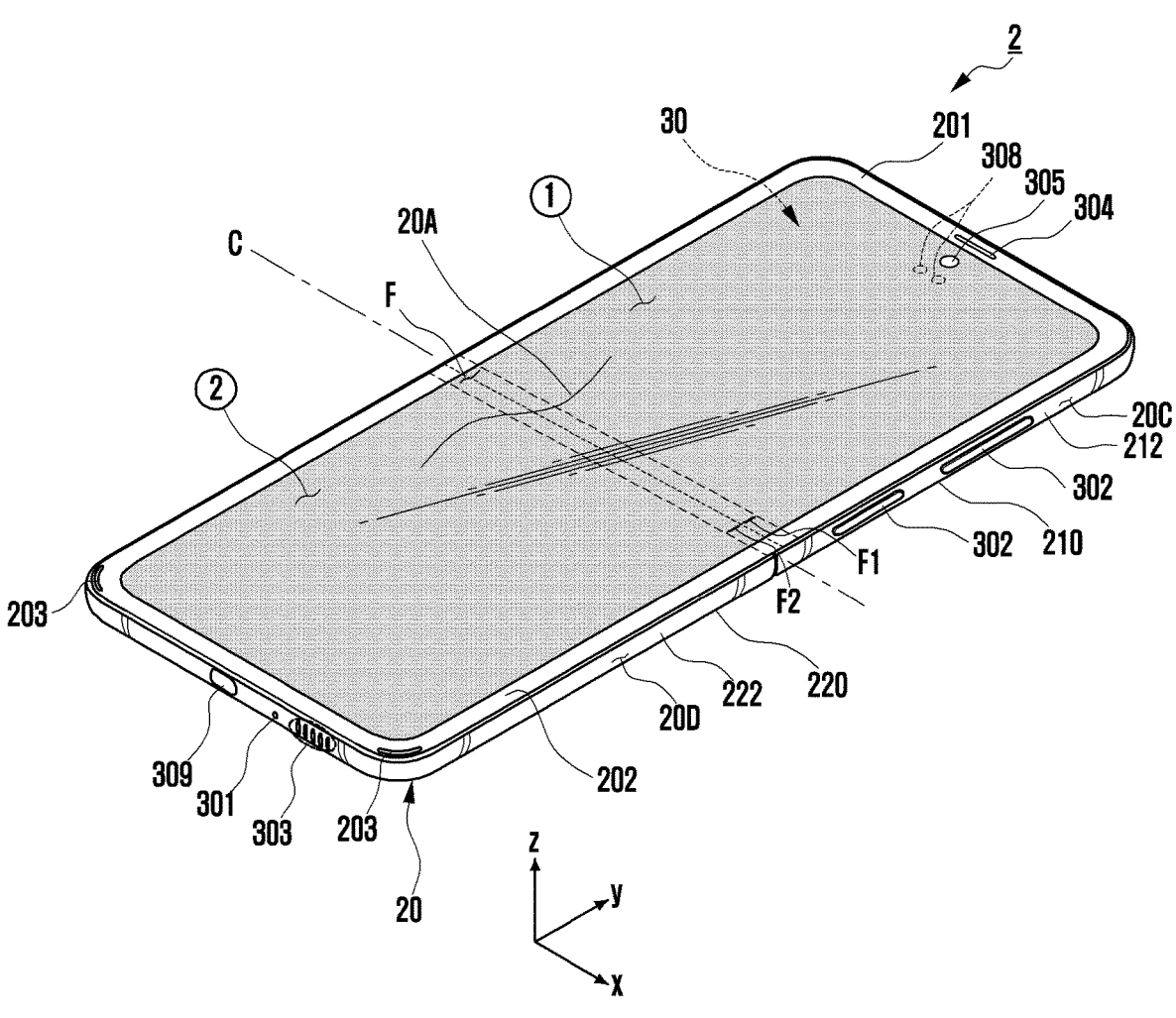
FIG. 2 is a front perspective view of an electronic device in an unfolded state according to an embodiment of the disclosure.
Figure 3:
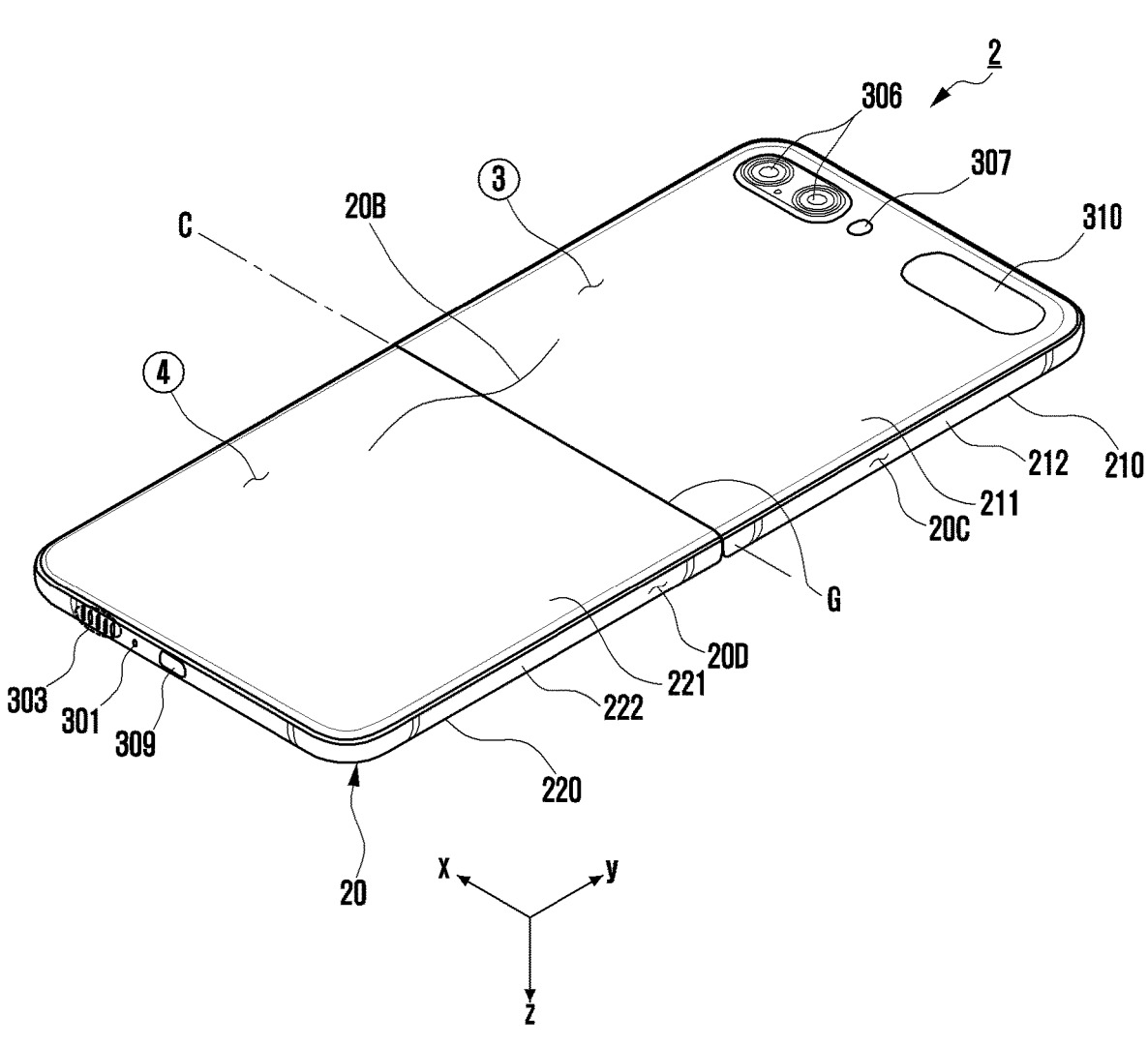
FIG. 3 is a rear perspective view of an electronic device in an unfolded state according to an embodiment of the disclosure.
Figure 4:
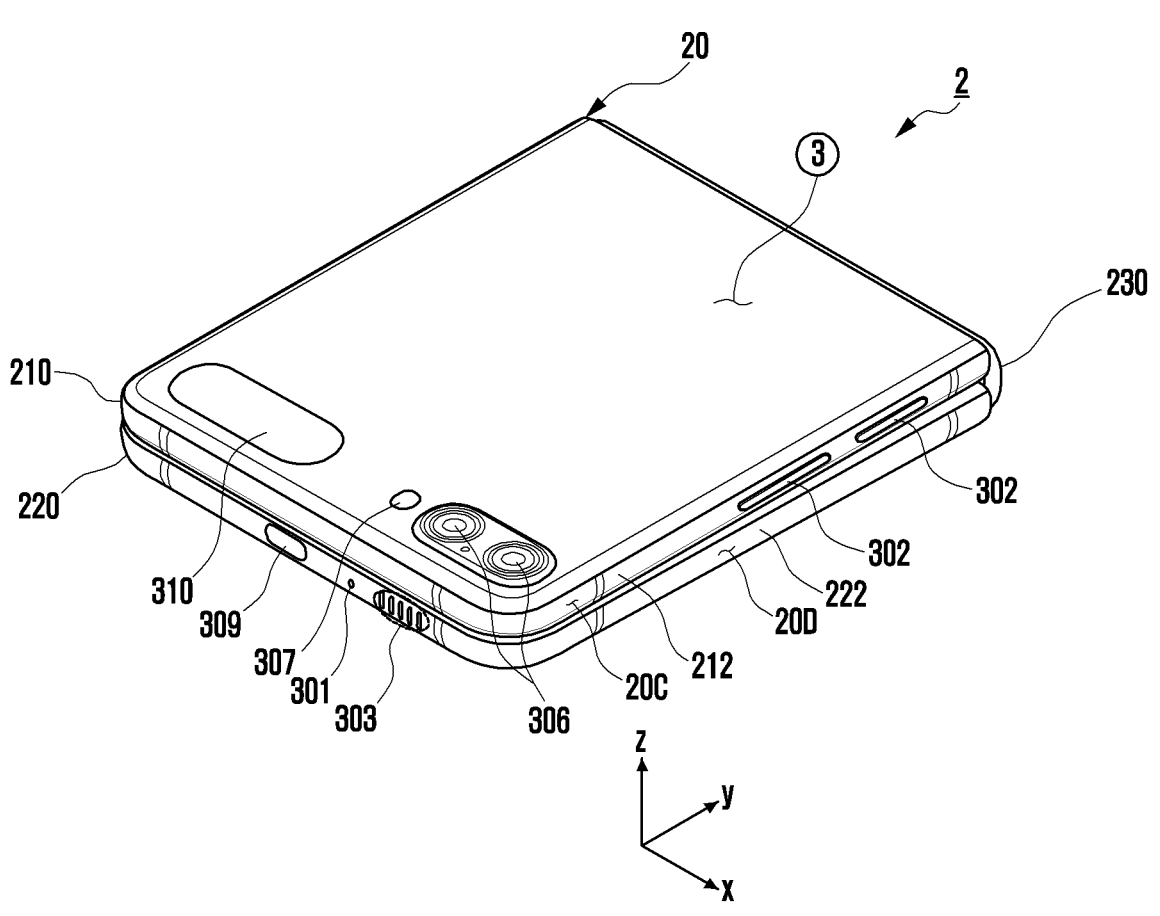
FIG. 4 is a perspective view of an electronic device in a folded state according to an embodiment of the disclosure.

FIG. 2 is a front perspective view of an electronic device 2 in an unfolded state or a flat state according to an embodiment of the disclosure. FIG. 3 is a rear perspective view of an electronic device 2 in an unfolded state according to an embodiment of the disclosure. FIG. 4 is a perspective view of an electronic device 2 in a folded state according to an embodiment of the disclosure. In various embodiments of the disclosure, for the convenience of description, a surface oriented in a direction in which the screen thereof is visually exposed is interpreted and used as the front surface of the electronic device 2, and a surface oriented a direction opposite thereto is interpreted and used as the rear surface of the electronic device 2.

Referring to FIGS. 2, 3, and 4, in an embodiment of the disclosure, the electronic device 2 may include a foldable housing 20. The foldable housing 20 may include a first surface 20A of the electronic device 2, and a second surface 20B of the electronic device 2, which is positioned at the side opposite to the first surface 20A. The foldable housing 20 may include a first side surface 20C and a second side surface 20D of the electronic device 2, which are surround at least a part of a space between the first surface 20A and the second surface 20B. The first surface 20A may include a first cover area ①, a second cover area ②, and a folding cover area F between the first cover area ① and the second cover area ②. In an unfolded state of the foldable housing 20, the first surface 20A may be a substantially flat surface, and the first cover area ①, the second cover area ②, and the folding cover area F may be oriented in substantially the same direction. The second surface 20B may include a third cover area ③ and a fourth cover area ④. The third cover area ③) may be positioned at the side opposite to the first cover area ① of the first surface 20A, and may be oriented the direction opposite to the first cover area ①. The fourth cover area ④ may be positioned at the side opposite to the second cover area ② of the first surface 20A, and may be oriented the direction opposite to the second cover area ②. In an embodiment of the disclosure, the foldable housing 20 may be implemented as an in-folding structure in which the first surface 20A is folded inward. For example, in an unfolded state (see FIG. 2) of the foldable housing 20, the folding cover area F may be disposed as a flat surface, and the first cover area ① and second cover area ② may form an angle of about 180 degrees. In a folded state (see FIG. 4) of the foldable housing 20, the folding cover area F may be disposed as a curved surface, and the first cover area ① and the second cover area ② may form an angle different from the angle of about 180 degrees. A folded state may include a fully folded state or an intermediate state. The fully folded state (see FIG. 4) may be a maximally folded state in which the first cover area ① and the second cover area ② of the first surface 20A can no longer be close to each other, and for example, the first cover area ① and the second cover area ② may form an angle of about 0 degrees-about 10 degrees. In the fully folded state, the first surface 20A may not be substantially exposed to the outside. An intermediate state may mean a state between an unfolded state and the fully folded state. The folding cover area F of the first surface 20A may be more bent in the fully folded state than in an intermediate state.

According to an embodiment of the disclosure, the foldable housing 20 may include a front cover (e.g., a window) 201 forming at least a part of the first surface 20A. A flexible display 30 may be positioned in the inner space of the electronic device 2 to at least partially overlap the front cover 201. The front cover 201 may protect the flexible display 30 from the outside, and may be substantially transparent. Light output from the flexible display 30 may pass through the front cover 201 and then travel to the outside. For example, the flexible display 30 may include a first display area (or an active area) overlapped with the first cover area ① of the first surface 20A, a second display area overlapped with the second cover area ② of the first surface 20A, and a third display area overlapped with the folding cover area F. A screen may mean an area capable of displaying an image in a device including the flexible display 30 and the front cover 201, and for example, may include a display area of the flexible display 30 and an area of the front cover 201, which is overlapped therewith. In some embodiments of the disclosure, the front cover 201 may be an element included in the flexible display 30, and may be formed integrally with the flexible display 30. The front cover 201 may be implemented in the form of a thin film, such as a film so as to have flexuosity. For example, the front cover 201 may include a plastic film (e.g., a polyimide film) or thin film glass (e.g., ultra-thin glass (UTG)). In some embodiments of the disclosure, the front cover 201 may include multiple layers. For example, the front cover 201 may be a form in which a protective layer or a coating layer made of various polymer materials (e.g., polyester (PET), polyimide (PI), or thermoplastic polyurethane (TPU)) is disposed on a plastic film or thin film glass.

According to an embodiment of the disclosure, the foldable housing 20 may include a first housing part (or a first housing structure) 210, a second housing part (or a second housing structure) 220, and/or a hinge structure (or a hinge assembly). The first housing part 210 and the second housing part 220 may be connected by a hinge structure, and may mutually rotate with reference to a folding axis C (e.g., the rotation axis of a hinge structure) of the foldable housing 20. The first housing part 210 may include a first cover part of the front cover 201, which is positioned at one side with reference to the folding axis C, a first rear cover 211 forming at least a part of the third cover area ③ of the second surface 20B, and a first lateral member (or a first lateral bezel structure) 212 at least partially surrounding a space between the first cover part and the first rear cover 211 and forming the first side surface 20C. For example, the first cover part of the front cover 201 may form the first cover area ① and a first folding cover area F1 of the folding cover area F, which is positioned at one side with reference to the folding axis C. The second housing part 220 may include a second cover part of the front cover 201, which is positioned at one side with reference to the folding axis C, a second rear cover 221 forming at least a part of the fourth cover area ④ of the second surface 20B, and a second lateral member (or a second lateral bezel structure) 222 at least partially surrounding a space between the second cover part and the second rear cover 221 and forming the second side surface 20D. For example, the second cover part of the front cover 201 may form the second cover area ② and a second folding cover area F2 of the folding cover area F, which is positioned at the other side with reference to the folding axis C. In the fully folded state of the foldable housing 20, the first lateral member 212 and the second lateral member 222 may be aligned to at least partially overlap each other. For example, the first lateral member 212 and/or the second lateral member 222 may be formed of ceramic, polymer, metal (e.g., aluminum, stainless steel, or magnesium), or a combination of at least two of the materials. The first rear cover 211 and/or the second rear cover 221 may be substantially opaque. For example, the first rear cover 211 and/or the second rear cover 221 may be formed of coated or colored glass, ceramic, polymer, metal (e.g., aluminum, stainless steel, or magnesium), or a combination of at least two of the materials. In some embodiments of the disclosure, the first rear cover 211 and the first lateral member 212 may be integrally formed, and may include the same material. In some embodiments of the disclosure, the second rear cover 221 and the second lateral member 222 may be integrally formed, and may include the same material. In an embodiment of the disclosure, the hinge structure may include a hinge cover 230 (see FIG. 4). In case of switching from the folded state in FIG. 4 to the unfolded state in FIG. 3, the hinge cover 230 may cover to prevent the inside of the electronic device 2 from being exposed toward the folding axis C due to the opening of a gap G between the first housing part 210 and the second housing part 220. As illustrated in FIG. 3, in the fully unfolded state of the electronic device 2, the gap G may be substantially absent, and the hinge cover 230 may not be exposed to the outside by being covered by the first housing part 210 and the second housing part 220. Although not illustrated therein, in an intermediate state, the hinge cover 230 may be partially exposed between the first housing part 210 and the second housing part 220. The hinge cover 230 may be more exposed in the folded state in FIG. 4 than in an intermediate state.

According to some embodiments of the disclosure, the foldable housing 20 may be referred to as a structure (e.g., a foldable housing structure or a foldable housing assembly) forming at least a part of the first surface 20A, the second surface 20B, the first side surface 20C, and the second side surface 20D. For example, the foldable housing 20 may include a first housing part, a second housing part, and a folding part connected to the first housing part and the second housing part. The folding part may mean a more flexible portion than the first housing part and the second housing part, and may be bent in a folded state of the electronic device 2. For example, the folding part may include a structure (e.g., a multi-bar structure) in which multiple bars are arranged, and may be implemented as various other structures configured to have bending properties while connecting the first housing part and the second housing part without not being limited thereto.

According to an embodiment of the disclosure, the electronic device 2 may further include a cover member 202 disposed on the front cover 201. The cover member 202 may be positioned in an area of the front cover 201, which is around the screen along the edge of the front cover 201. In case that the electronic device 2 is switched from the open state in FIG. 2 to the folded state in FIG. 4, the cover member 202 may alleviate impact between the first housing part 210 and the second housing part 220 to reduce damage of the front cover 201. For example, in case that the electronic device 2 is switched from the open state in FIG. 2 to the folded state in FIG. 4, a part of the cover member 202, which is positioned in the first housing part 210, and another a part of the cover member 202, which is positioned in the second housing part 220, may come into contact with each other, and the first cover area ① and the second cover area ② of the front cover 201 may be positioned in a close state without being in contact with each other. The cover member 202 may also contribute to aesthetics as a bezel surrounding the screen. In some embodiments of the disclosure, the cover member 202 may be omitted due to screen expansion or may be formed in another form, such as a buffer member indicated by reference numeral 203.

For example, the electronic device 2 may be the electronic device 101 in FIG. 1 or may include at least one of the elements included in the electronic device 101 in FIG. 1. In an embodiment of the disclosure, the electronic device 2 may include an input module (e.g., the input module 150 in FIG. 1), a sound output module (e.g., the sound output module 155 in FIG. 1), a camera module (e.g., the camera module 180 in FIG. 1), a sensor module (e.g., the sensor module 176 in FIG. 1), a connection terminal (e.g., the connection terminal 178 in FIG. 1), or a sub-display 310 (e.g., the display module 160 in FIG. 1). In some embodiments of the disclosure, at least one of the elements of the electronic device 2 may be omitted, or the electronic device may additionally include other elements.

For example, the input module may include a microphone positioned inside the electronic device 2, and a microphone hole 301 formed through the second side surface 20D to correspond to the microphone. The position or the number of the input module including the microphone and the microphone hole 301 corresponding thereto is not be limited to the illustrated example and may be various. In some embodiments of the disclosure, the electronic device 2 may include multiple microphones capable of detecting the direction of sound.

For example, the input module may include key input devices 302. For example, the key input devices 302 may be positioned in an opening (not shown) formed through the first side surface 20C. In some embodiments of the disclosure, the electronic device 2 may not include a part or all of the key input devices 302, and the key input device not included therein may be implemented as a soft key by using the flexible display 30. In some embodiments of the disclosure, the input module may include at least one sensor module.

For example, the sound output module may include a speaker positioned inside the electronic device 2, and a speaker hole 303 formed through the second side surface 20D to correspond to the speaker. The position or the number of the sound output module including the speaker and the speaker hole 303 corresponding thereto is not be limited to the illustrated example and may be various. In some embodiments of the disclosure, the microphone hole 301 and the speaker hole 303 may be implemented as one hole. In some embodiments of the disclosure, a piezo speaker, in which the speaker hole 303 is omitted, may also be implemented. For example, the sound output module may include a receiver for phone calling, which is positioned inside the electronic device 2, and a receiver hole formed through the first surface 20A to correspond to the receiver for phone calling.

For example, the camera module may include a first camera module (or a front camera module) 305 positioned to correspond to the first surface 20A, or multiple second camera modules (or rear camera modules) 306 positioned to correspond to the second surface 20B. Each of the first camera module 305 and/or the multiple second camera modules 306 may include one lens or multiple lenses, an image sensor, and/or an image signal processor. The position or the number of the first camera module 305 or the multiple second camera modules 306 is not be limited to the illustrated embodiment and may be various.

According to an embodiment of the disclosure, the flexible display 30 may include an opening aligned with the first camera module 305. External light may reach the first camera module 305 through openings of the front cover 201 and the flexible display 30. In some embodiments of the disclosure, an opening of the flexible display 30 may also be formed in a notch shape according to the position of the first camera module 305. In some embodiments of the disclosure, the first camera module 305 may be disposed at the lower end the flexible display 30, and may perform related functions (e.g., image photographing) while the position of the first camera module 305 is not visually distinguished (exposed). For example, the first camera module 305 may be positioned on the rear surface of the flexible display 30, or below or beneath the flexible display 30, and may include a hidden under display camera (UDC). In some embodiments of the disclosure, the first camera module 305 may be positioned to be aligned with a recess formed on the rear surface of the flexible display 30. The first camera module 305 may be disposed to overlap at least a part of the screen, and may obtain an image of an external subject without being visually exposed to the outside. In this case, a partial area of the flexible display 30, which at least partially overlaps the first camera module 305, may include a different pixel structure and/or wire structure compared to the other areas. For example, a partial area of the flexible display 30, which at least partially overlaps the first camera module 305, may have a different pixel density compared to other areas. A pixel structure and/or wire structure formed in a partial area of the flexible display 30, which at least partially overlaps the first camera module 305, may reduce the loss of light between the outside and the first camera module 305. In some embodiments of the disclosure, a pixel may also not be disposed in a partial area of the flexible display 30, which at least partially overlaps the first camera module 305.

According to an embodiment of the disclosure, the multiple second camera modules 306 may have different attributes (e.g., angles of view) or functions, and for example, may include a dual camera or a triple camera. The multiple second camera modules 306 may include multiple camera modules including lenses having different angles of view, and the electronic device 2 may control to change angles of view of the camera modules, which is performed in the electronic device 2, based on a user selection. The multiple second camera modules 306 may include at least one of a wide-angle camera, a telephoto camera, a color camera, a monochrome camera, or an infrared (IR) camera (e.g., a time of flight (TOF) camera or a structured light camera). In some embodiments of the disclosure, the IR camera may also be operated as at least a part of a sensor module. The electronic device 2 may include a flash 307 as a light source for the multiple second camera modules 306. For example, the flash 307 may include a light-emitting diode or a xenon lamp.

The sensor module may generate electrical signals or data values corresponding to an internal operation state of the electronic device 2 or an external environment state. For example, the sensor module may include at least one of a proximity sensor, a gesture sensor, a gyro sensor, a barometric pressure sensor, a magnetic sensor, an acceleration sensor, a grip sensor, a color sensor, an infrared (IR) sensor, a biometric sensor (e.g., a fingerprint sensor, an HRM sensor), a temperature sensor, a humidity sensor, or an illuminance sensor.

According to an embodiment of the disclosure, the sensor module may include an optical sensor 308 positioned inside the electronic device 2 to correspond to the first surface 20A. For example, the optical sensor 308 may include a proximity sensor or an illuminance sensor. The optical sensor 308 may be aligned with an opening formed through the flexible display 30. External light may be introduced into the optical sensor 308 through openings of the front cover 201 and the flexible display 30. In some embodiments of the disclosure, the optical sensor 308 may be positioned at the lower end of the flexible display 30, and may perform a related function while the position of the optical sensor 308 is not visually distinguished (or exposed). For example, the optical sensor 308 may be positioned on the rear surface of the flexible display 30, or below or beneath the flexible display 30. In some embodiments of the disclosure, the optical sensor 308 may be positioned to be aligned with a recess formed on the rear surface of the flexible display 30. The optical sensor 308 may be disposed to overlap at least a part of the screen, and may perform a sensing function without being exposed to the outside. In this case, a partial area of the flexible display 30, which at least partially overlaps the optical sensor 308, may include a different pixel structure and/or wire structure compared to the other areas. For example, a partial area of the flexible display 30, which at least partially overlaps the optical sensor 308, may have a different pixel density compared to other areas. In some embodiments of the disclosure, the sensor module may include a fingerprint sensor (not shown) positioned below the flexible display 30. The fingerprint sensor may be implemented as a capacitive type, an optical type, or an ultrasonic type. A pixel structure and/or wire structure formed in a partial area of the flexible display 30, which at least partially overlaps the sensor module, may reduce the loss thereof in case that various types of signals (e.g., light or ultrasound) related to the sensor module pass between the outside and the sensor module. In some embodiments of the disclosure, multiple pixels may not be arranged in a partial area of the flexible display 30, which at least partially overlaps the sensor module.

For example, the connection terminal may include a connector (e.g., a USB connector) positioned inside the electronic device 2. The electronic device 2 may include a connector hole 309 formed through the second side surface 20D to correspond to the connector. The electronic device 2 may transmit and/or receive power and/or data to and/or from an external electronic device electrically connected to the connector through the connector hole 309. The position or the number of the connector and the connector hole 309 corresponding thereto is not be limited to the illustrated example and may be various.

For example, the sub-display 310 may be positioned inside the first housing part 210 to be adjacent to the first rear cover 211. A partial area of the first rear cover 211 may overlap the sub-display 310, and may be substantially transparent. The electronic device 2 may output an image through the sub-display 310 instead of the flexible display 30 in the folded state in FIG. 4.

According to some embodiments of the disclosure, the electronic device 2 may be implemented as an out-folding structure in which the front surface 20A (or the screen) is folded outward.

Figure 5:
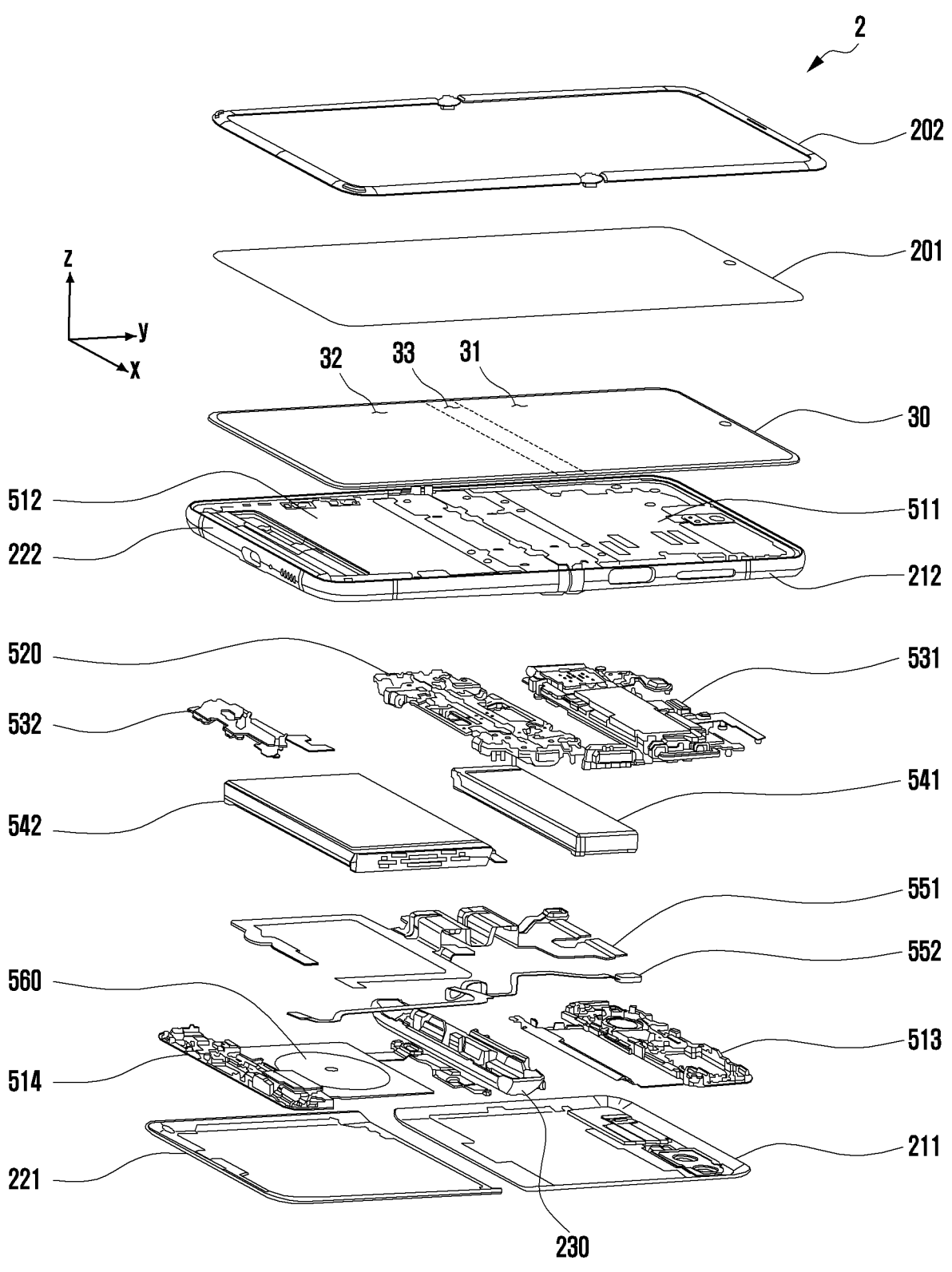
FIG. 5 is an exploded perspective view of an electronic device according to an embodiment of the disclosure.

FIG. 5 is an exploded perspective view of an electronic device 2 according to an embodiment of the disclosure.

Referring to FIG. 5, in an embodiment of the disclosure, the electronic device 2 may include the cover member 202, the front cover 201, the flexible display 30, the first lateral member 212, the second lateral member 222, a first support member 511, a second support member 512, a hinge 520, a first board assembly 531, a second board assembly 532, a first battery 541, a second battery 542, a first electrical path 551, a second electrical path 552, a third support member 513, a fourth support member 514, an antenna structure 560, the first rear cover 211, the second rear cover 221, or the hinge cover 230. In some embodiments of the disclosure, at least one of the elements of the illustrated example may be omitted from the electronic device 2, or the electronic device may additionally include other elements.

For example, the first support member (e.g., a first bracket) 511 may be positioned inside the first housing part 210 (see FIG. 2) to be connected to the first lateral member 212, or may be integrally formed with the first lateral member 212. For example, the second support member (e.g., a second bracket) 512 may be positioned inside the second housing part 220 (see FIG. 2) to be connected to the second lateral member 222, or may be integrally formed with the second lateral member 222. For example, the first support member 511 and/or the second support member 512 may be formed of a metal material and/or a non-metal material (e.g., polymer). The first support member 511 may be defined as an element of the first housing part 210, and the second support member 512 may be defined as an element of the second housing part 220. In some embodiments of the disclosure, a configuration including the first support member 511 and the first lateral member 212 may be referred to as a first front case, and a configuration including the second support member 512 and the second lateral member 222 may be referred to as a second front case.

For example, the hinge 520 may connect the first support member 511 and the second support member 512. The first housing part 210 and the second housing part 220 illustrated in FIG. 2 may mutually rotate with reference to a rotation axis (e.g., the folding axis C in FIG. 2) of the hinge 520. A configuration including the hinge 520 and the hinge cover 230 may be referred to as a hinge structure.

For example, the flexible display 30 may include a first display area 31 disposed in the first support member 511, a second display area 32 disposed in the second support member 512, and a third display area 33 between the first display area 31 and the second display area 32. The third display area 33 may be a portion corresponding to the folding cover area F in FIG. 2, and for example, may be disposed in a flat-surface shape in an unfolded state (see FIG. 2) of the electronic device 2 and disposed in a curved-surface shape in a closed state (see FIG. 4) of the electronic device 2.

According to an embodiment of the disclosure, the first board assembly 531 may be disposed on the first support member 511 between the first support member 511 and the first rear cover 211. The second board assembly 532 may be disposed on the second support member 512 between the second support member 512 and the second rear cover 221. For example, the first board assembly 531 may include a first printed circuit board (PCB) (e.g., or printed board assembly (PBA)). The first board assembly 531 may be disposed on the first printed circuit board or may include electronic components (e.g., at least one of the elements included in the electronic device 101 in FIG. 1) electrically connected to the first printed circuit board. For example, the second board assembly 532 may include a second printed circuit board (not shown) electrically connected to the first printed circuit board of the first board assembly 531. The second board assembly 532 may be disposed on the second printed circuit board or may include various electronic components (e.g., at least one of the elements included in the electronic device 101 in FIG. 1) electrically connected to the second printed circuit board. In some embodiments of the disclosure, the first board assembly 531 or the second board assembly 532 may include a primary PCB (or a main PCB), a secondary PCB (or a slave PCB) disposed to partially overlap the primary PCB, and/or an interposer substrate between the primary PCB and the secondary PCB.

For example, the first battery 541 may be disposed in the first support member 511 between the first support member 511 and the first rear cover 211. For example, the second battery 542 may be disposed in the second support member 512 between the second support member 512 and the second rear cover 221. The first battery 541 and/or the second battery 542 may be a device for supplying power to at least one element of the electronic device 2, and for example, may include a non-rechargeable primary battery, a rechargeable secondary battery, or a fuel cell. The first battery 541 or the second battery 542 may be integrally disposed inside the electronic device 2, and in some embodiments of the disclosure, may be disposed detachably from the electronic device 2. In some embodiments of the disclosure, the first battery 541 or the second battery 542 may be omitted therefrom.

For example, the third support member 513 may be disposed between the first support member 511 and the first rear cover 211, and may be coupled to the first support member 511 through a fastening element, such as a bolt. At least a part of the first board assembly 531 may be disposed between the first support member 511 and the third support member 513, and the third support member 513 may cover at least a part of the first board assembly 531. For example, the fourth support member 514 may be disposed between the second support member 512 and the second rear cover 221, and may be coupled to the second support member 512 through a fastening element, such as a bolt. At least a part of the second board assembly 532 may be disposed between the second support member 512 and the fourth support member 514, and the fourth support member 514 may cover at least a part of the second board assembly 532. The third support member 513 and/or the fourth support member 514 may be formed of a metal material and/or a non-metal material (e.g., polymer). In some embodiments of the disclosure, the third support member 513 and/or the fourth support member 514 may be referred to as a rear case.

For example, the first electrical path 551 or the second electrical path 552 may electrically connect the first printed circuit board included in the first board assembly 531 and the second printed circuit board included in the second board assembly 532. In an embodiment of the disclosure, the first electrical path 551 or the second electrical path 552 may include a flexible printed circuit board (FPCB) or a rigid flex printed circuit board (e.g., a rigid flexible printed circuit board (RFPCB)) extending from the first housing part 210 (see FIG. 2) to the second housing part 220 (see FIG. 2). A signal (e.g., command or data) between the first printed circuit board included in the first board assembly 531 and the second printed circuit board included in the second board assembly 532 may be transmitted through the first electrical path 551 and/or the second electrical path 552.

According to an embodiment of the disclosure, at least a part of the antenna structure 560 may be positioned between the second support member 512 and the second rear cover 221. For example, the antenna structure 560 may be implemented in the form of a film, such as a flexible printed circuit board. The antenna structure 560 may include at least one conductive pattern utilized as a loop-type radiator. For example, the at least one conductive pattern may include a planar helical conductive pattern (e.g., a planar coil or a pattern coil).

Figure 6:
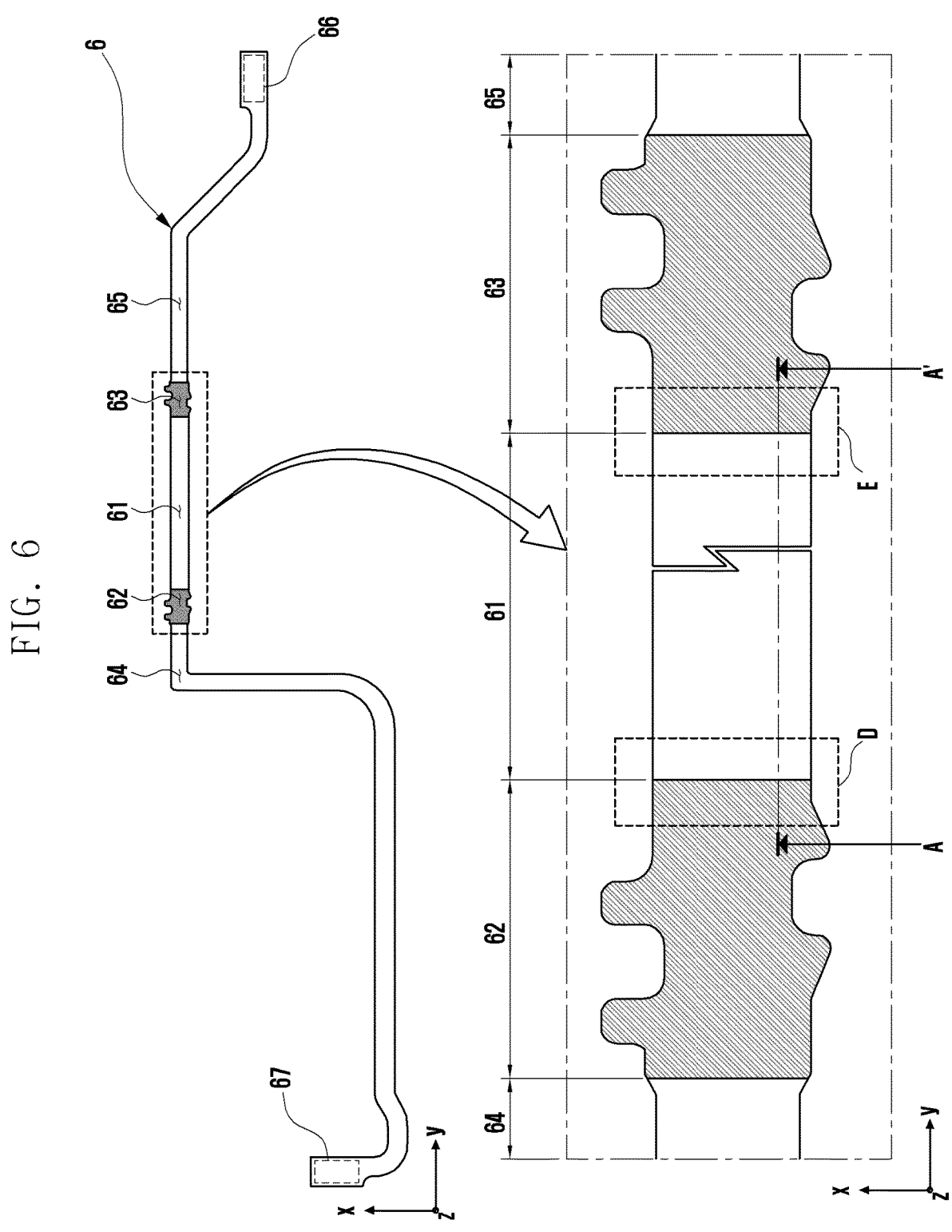
FIG. 6 is a plan view of a part of a circuit board in case that the circuit board included in an electronic device is in an unfolded state according to an embodiment of the disclosure.

FIG. 6 is a plan view of a circuit board 6 in case that the circuit board 6 included in an electronic device 2 is according to an unfolded state in an embodiment of the disclosure.

Referring to FIG. 6, in an embodiment of the disclosure, a circuit board (or a circuit substrate) 6 may include a first portion 61, a second portion 62, or a third portion 63. The first portion 61 may be positioned between the second portion 62 and the third portion 63. The first portion 61 may have flexibility greater than the second portion 62 and the third portion 63. For example, compared to the second portion 62 and the third portion 63, the first portion 61 may have a bending characteristic (flexibility) capable of being bent without damage while reducing stress generation under the same condition. In an embodiment of the disclosure, the first portion 61 may be a substantially flexible portion (or flexible section) of the circuit board 6, and the second portion 62 and the third portion 63 may be substantially rigid portions (or rigid sections) of the circuit board 6. For example, the first portion 61 may have a thinner thickness or fewer lamination layers than the second portion 62 and the third portion 63, and due to this, may be implemented more flexibly than the second portion 62 and the third portion 63. For example, the first portion 61 may include a material different from those of the second portion 62 and the third portion 63, and thus may be implemented more rigidly than the second portion 62 and the third portion 63. The circuit board 6 including a flexible portion and a rigid portion, or portions having different flexibility may be formed using various other structures. The circuit board 6 may include a flexible fourth portion 64 or a flexible fifth portion 65 implemented in substantially similar or identical manner to the first portion 61. The second portion 62 may be positioned between the first portion 61 and the fourth portion 64, and the third portion 63 may be positioned between the first portion 61 and the fifth portion 65. In some embodiments of the disclosure, a part of the circuit board 6, for example, the second portion 62 and the fourth portion 64, or the third portion 63 and the fifth portion 65 may be omitted. The circuit board 6 is not limited to the illustrated example, and may be implemented in various other forms including a flexible portion, such as the first portion 61 and a rigid portion, such as the second portion 62 (or the third portion 63). The circuit board 6 may be a form including a flexible portion and a rigid portion, and for example, may be referred to as a rigid flexible printed circuit board (RFPCB). In some embodiments of the disclosure, the circuit board 6 may be a form including portions having different flexibility, and for example, may be referred to as a flexible printed circuit board (FPCB).

According to an embodiment of the disclosure, the first electrical path 551 or the second electrical path 552 in FIG. 5 may include at least a part of the circuit board 6 according to the embodiment of FIG. 6. Referring to FIG. 2 and FIG. 6, the second portion 62 and the fourth portion 64 of the circuit board 6 may be positioned in the first housing part 210, and the third portion 63 and fifth portion 65 of the circuit board 6 may be positioned in the second housing 220. The first portion 61 of the circuit board 6 may be disposed to cross the first housing part 210 and the second housing part 220, and may be positioned to correspond to the hinge 520 (see FIG. 5). For example, in case that the electronic device 2 is switched from an unfolded state (see FIG. 2) to a folded state (see FIG. 4), at least a part of the first portion 61 may be bent. Referring to FIG. 5 and FIG. 6, the first board assembly 531 and the second board assembly 532 may be electrically connected through the circuit board 6 (e.g., the first electrical path 551 or the second electrical path 552). For example, a first connector 66 positioned at one end of the circuit board 6 may be electrically connected to the first board assembly 531, and a second connector 67 positioned at the other end of the circuit board 6 may be electrically connected to the second board assembly 532. The circuit board 6 may include at least one signal line (not shown). For example, a signal (or power) between the first board assembly 531 and the second board assembly 532 may be transmitted through at least one signal line included in the circuit board 6. In some embodiments of the disclosure, one end of the circuit board 6 may be electrically connected to the first board assembly 531 by using a conductive bonding material, such as solder without the first connector. In some embodiments of the disclosure, the other end of the circuit board 6 may be electrically connected to the second board assembly 532 by using a conductive bonding material, such as solder without the second connector. In some embodiments of the disclosure, the circuit board 6 may be integrally formed with the first printed circuit board included in first board assembly 531 and/or the second printed circuit board included in second board assembly 532, and thus a current-carrying structure, such as a connector may be omitted therefrom.

For example, the circuit board 6 may have multiple conductive layers stacked thereon, each of which includes at least one conductive pattern, and a dielectric (or an insulator) may be positioned between the multiple conductive layers. One or more conductive patterns included in the multiple conductive layers may be utilized as a signal line. One or more conductive patterns included in the multiple conductive layers may be utilized as a ground plane. Hereinafter, a conductive pattern utilized as at least a part of a signal line may be referred to as a signal line pattern (or a first circuit pattern or a first conductive pattern), and a conductive pattern utilized as at least a part of a ground plane may be referred to as a ground pattern (or a second circuit pattern or a second conductive pattern). The circuit board 6 may include multiple conductive vias. The conductive vias may be conductive holes drilled to allow a connection wire for electrically connecting conductive patterns of conductive layers different from each other to be disposed therethrough. For example, the conductive via may include a plated through hole (PTH), a laser via hole (LVH), a buried via hole (BVH), or a stacked via.

According to an embodiment of the disclosure, the circuit board 6 may include a ground structure. The ground structure may not be short-circuited with at least one signal line, and thus the signal or power delivered through the at least one signal line may be maintained. The ground structure may be electrically connected to the ground (e.g., the ground plane included in the first printed circuit board of the first board assembly 531) of the first board assembly 531 (see FIG. 5) electrically connected to one end of the circuit board 6. The ground structure may be electrically connected to the ground (e.g., the ground plane included in the second printed circuit board of the second board assembly 532) of the second board assembly 532 (see FIG. 5) electrically connected to the other one end of the circuit board 6. The ground structure may function as an electromagnetic shielding structure to reduce electromagnetic influence (e.g., electromagnetic interference (EMI)) on the at least one signal line. For example, the ground structure may reduce electromagnetic interference between multiple signal lines. For example, the ground structure may reduce influence (e.g., signal loss or signal transformation) of electromagnetic noise (e.g., EMI), which is generated inside the electronic device 2 (see FIG. 2) or introduced from the outside of the electronic device 2, on a signal delivered through at least one signal line included in the circuit board 6. For example, the ground structure may reduce influence of electromagnetic fields, which are generated when a current flows through the at least one signal line, on electrical elements around the circuit board 6. In an embodiment of the disclosure, the ground structure may include multiple ground patterns positioned on different layers included in the circuit board 6, and multiple conductive vias electrically connecting the multiple ground patterns.

According to an embodiment of the disclosure, the first portion 61, the second portion 62, the third portion 63, the fourth portion 64, and the fifth portion 65 of the circuit board 6 may be substantially the same, or may form an impedance included in a critical range. Impedance matching between the first portion 61, the second portion 62, the third portion 63, the fourth portion 64, and the fifth portion 65 may reduce power loss and/or transmission loss in case that a signal having a selected or designated frequency is transmitted through the at least one signal line. Due to impedance matching between the first portion 61, the second portion 62, the third portion 63, the fourth portion 64, and the fifth portion 65, signal integrity may be secured.

According to some embodiments of the disclosure, the circuit board 6 may be utilized as a transmission line in an antenna device (or an antenna system). The electronic device 2 in FIG. 2 may include at least one antenna and a wireless communication circuit (e.g., the wireless communication module 192 in FIG. 1) electrically connected to the at least one antenna. For example, the antenna may include at least one antenna radiator, the ground, or a transmission line. The at least one antenna radiator may form an electromagnetic field capable of transmitting and/or receiving signals of at least one frequency in a selected or designated frequency band when a radiation current is provided from the wireless communication circuit. The wireless communication circuit may process a transmission signal or a reception signal in at least one designated frequency band through the at least one antenna radiator. For example, the designated frequency band may include at least one of a low band (LB) (about 600 MHz-about 1 GHz), a middle band (MB) (about 1 GHz-about 2.3 GHz), a high band (HB) (about 2.3 GHz-about 2.7 GHz), or an ultra-high band (UHB) (about 2.7 GHz-about 6 GHz). The designated frequency band may include other frequency bands (e.g., about 6 GHz-about 100 GHz) in addition thereto. At least one antenna radiator may be positioned in the second housing part 220 (see FIG. 2). In an embodiment of the disclosure, at least a part of the second housing part 220 may be electrically connected to a wireless communication circuit to operate as an antenna radiator. For example, at least one conductive part included in the second lateral member (or a second lateral bezel structure) 222 (see FIG. 5), at least one conductive part included in the second support member 512, or at least a part of the second rear cover 221 (see FIG. 5) may be utilized as an antenna radiator. In some embodiments of the disclosure, the antenna radiator may be included in the antenna module 197 in FIG. 1. The transmission line may electrically connect the wireless communication circuit and the at least one antenna radiator, and may transmit a signal (voltage, or current) of a radio frequency (RF). For example, the ground (or the antenna ground) may include the ground (e.g., a ground plane) positioned on or included in the first printed circuit board of the first board assembly 531 (see FIG. 5). The wireless communication circuit may be positioned on the first printed circuit board of the first board assembly 531 (see FIG. 5).

According to some embodiments of the disclosure, the second portion 62 of the circuit board 6 may be electrically connected to a transmitter, and the third portion 63 of the circuit board 6 may be electrically connected to a receiver. The transmitter may be a primary integrated circuit (IC), and for example, may include the processor 120 and/or the wireless communication module 192 in FIG. 1. The receiver may be a secondary IC, and may include elements or modules (e.g., the antenna module 197 in FIG. 1) connected to the primary IC to exchange frequency signals.

According to some embodiments of the disclosure, the circuit board 6 can be positioned in various other electronic devices. For example, the circuit board 6 is not limited to the electronic device 2 in FIG. 2, and may be positioned in an electronic device (not shown) having an out-folding structure in which the screen thereof is folded outward. For another example, the circuit board 6 may be positioned in a bent shape inside various types of electronic devices (not shown), such as a bar type.

Figure 7:
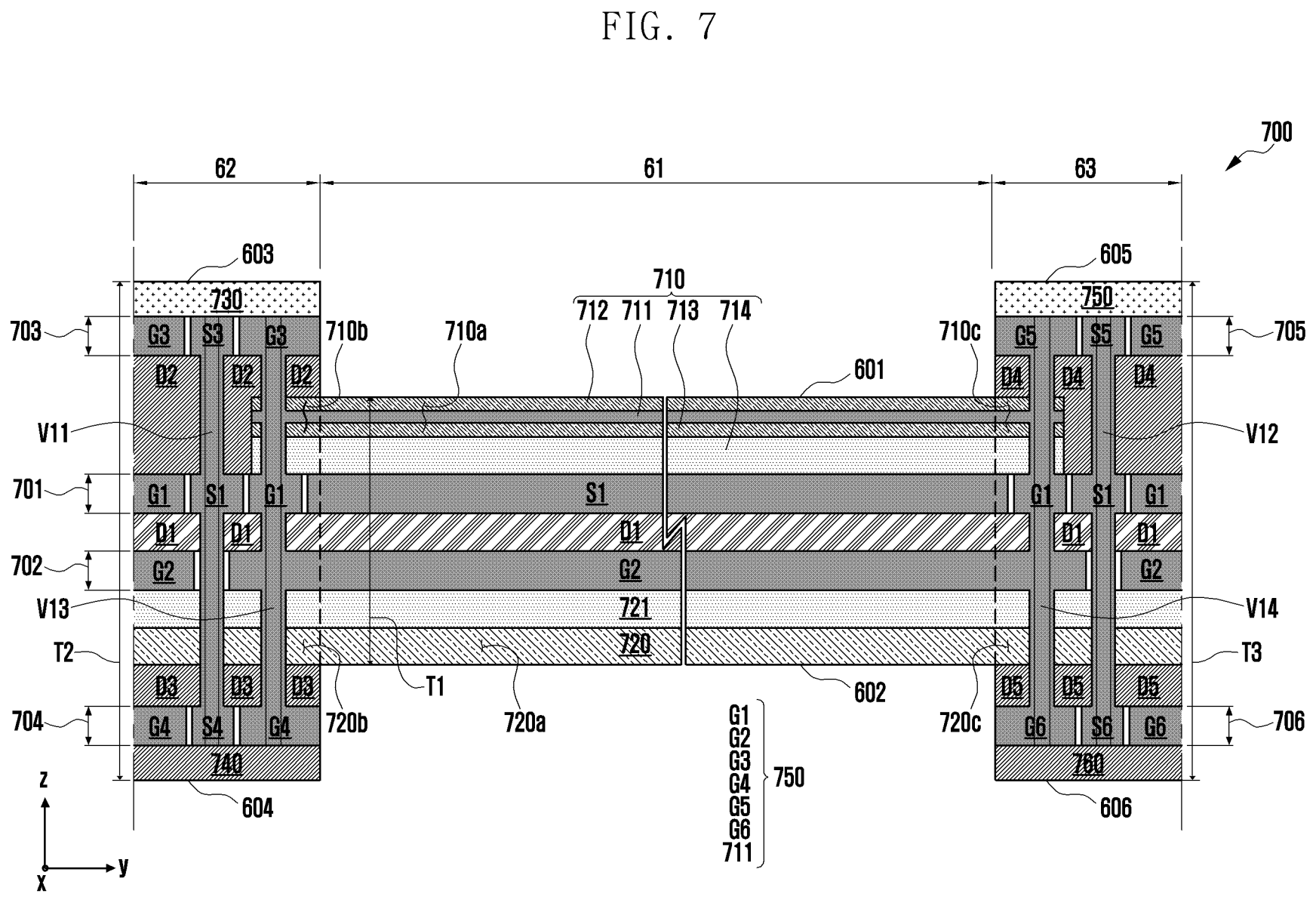
Figure 8:
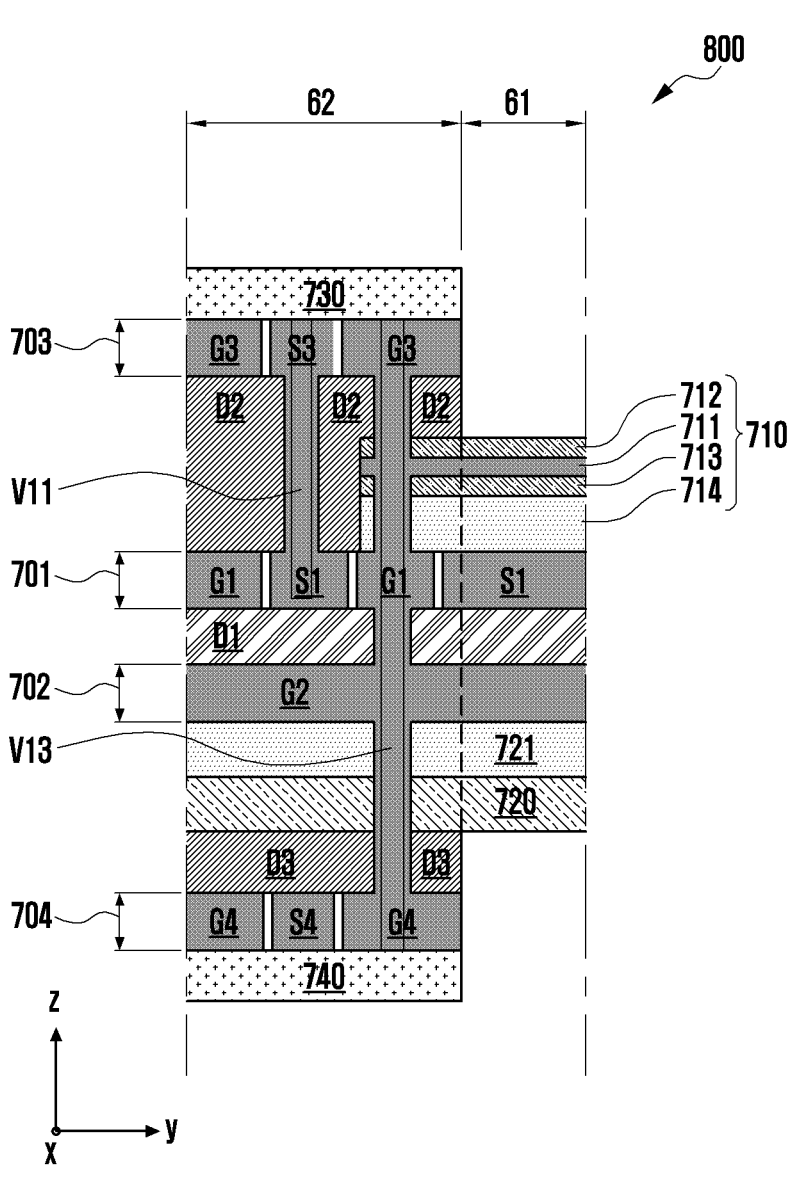
FIG. 8 illustrates a cross-sectional structure of a part of a circuit board including at least one first conductive via implemented as an LVH, as another embodiment modified from the embodiment of FIG. 7 according to an embodiment of the disclosure.
Figure 9:
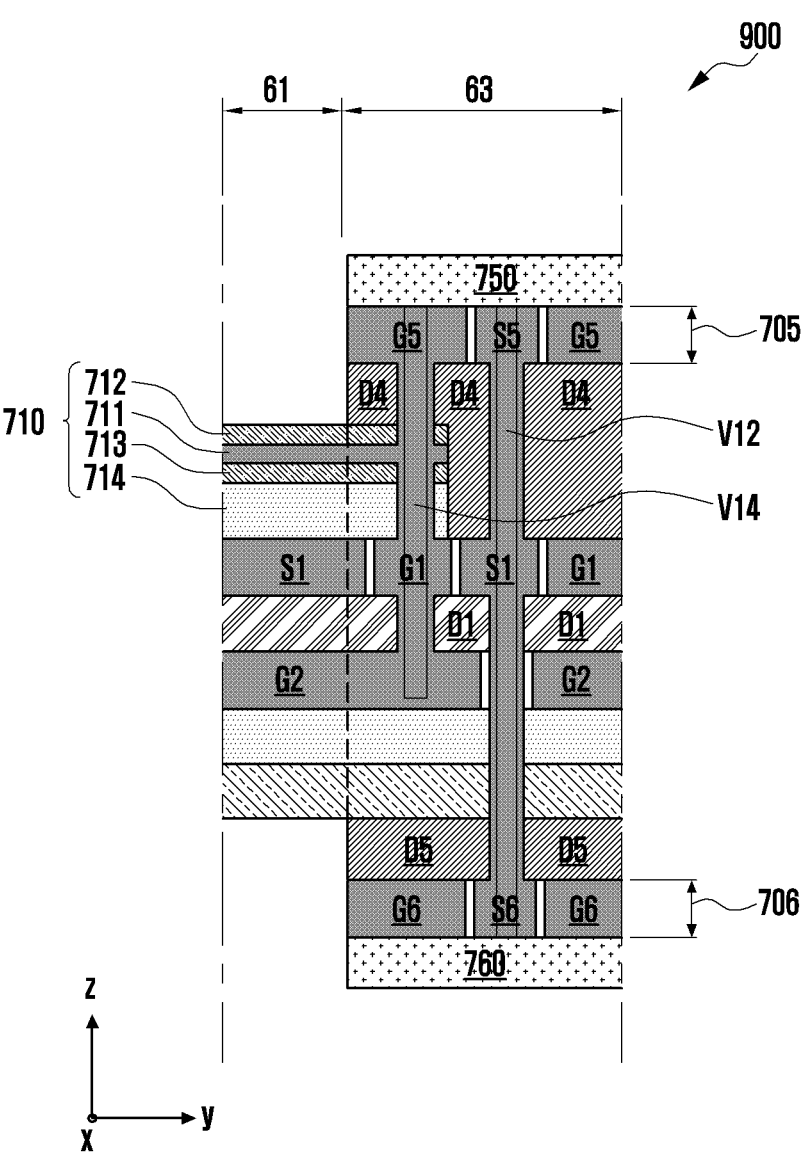
FIG. 9 illustrates a cross-sectional structure of a part of a circuit board including at least one fourth conductive via implemented as an LVH, as another embodiment modified from the embodiment of FIG. 7 according to an embodiment of the disclosure.
Figure 10:
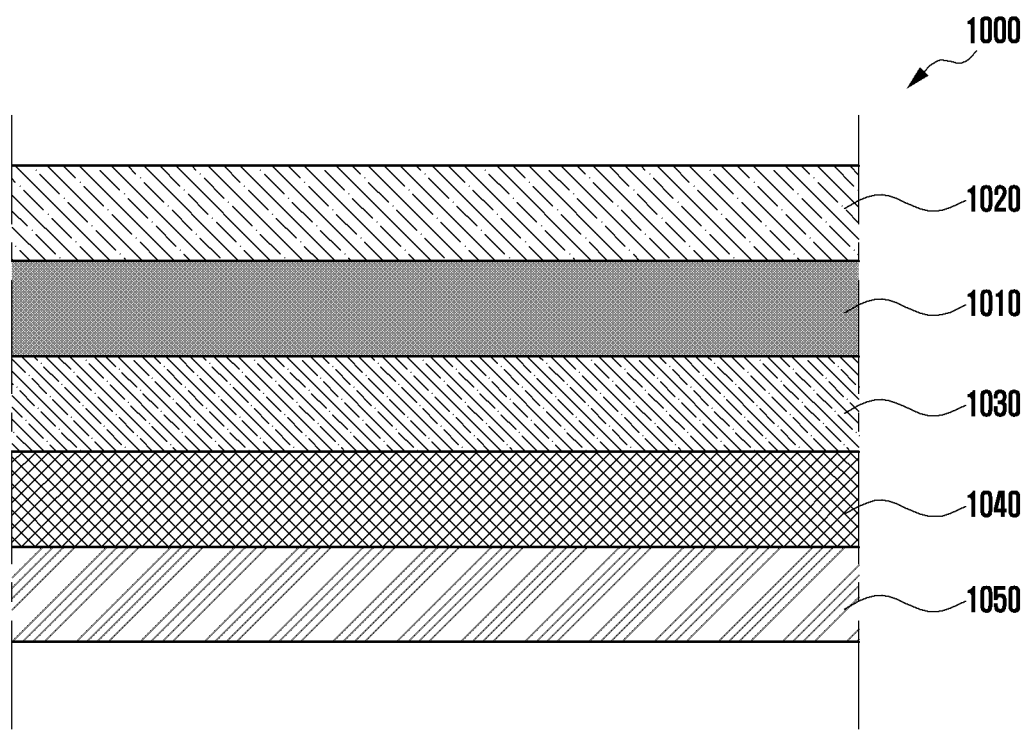
FIG. 10 illustrates a cross-sectional structure of a coverlay film having an electromagnetic shielding property according to an embodiment of the disclosure.
Figure 11:
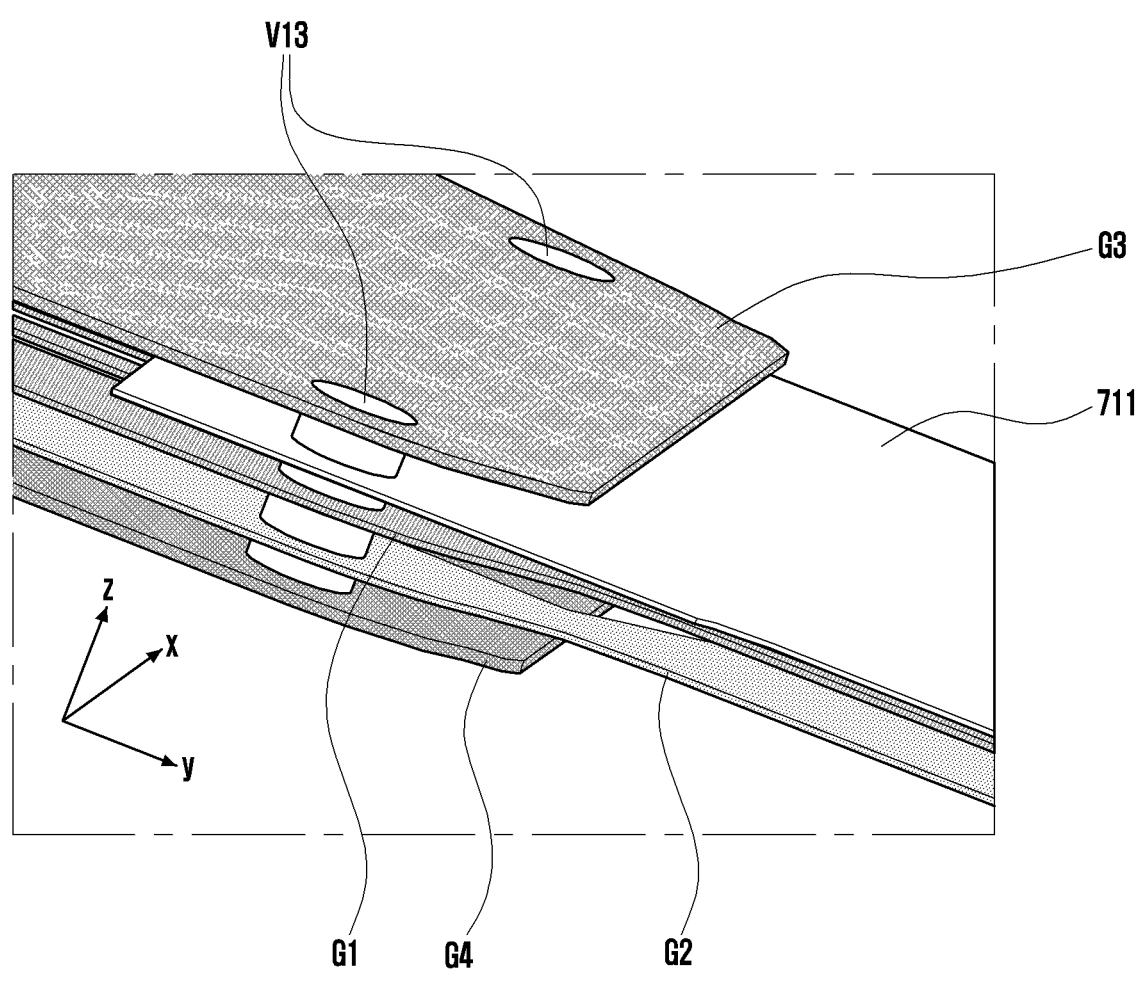
FIG. 11 is a perspective view of a part of a ground structure included in a circuit board at a portion indicated by reference numeral "D" in FIG. 6 according to an embodiment of the disclosure.
Figure 12:
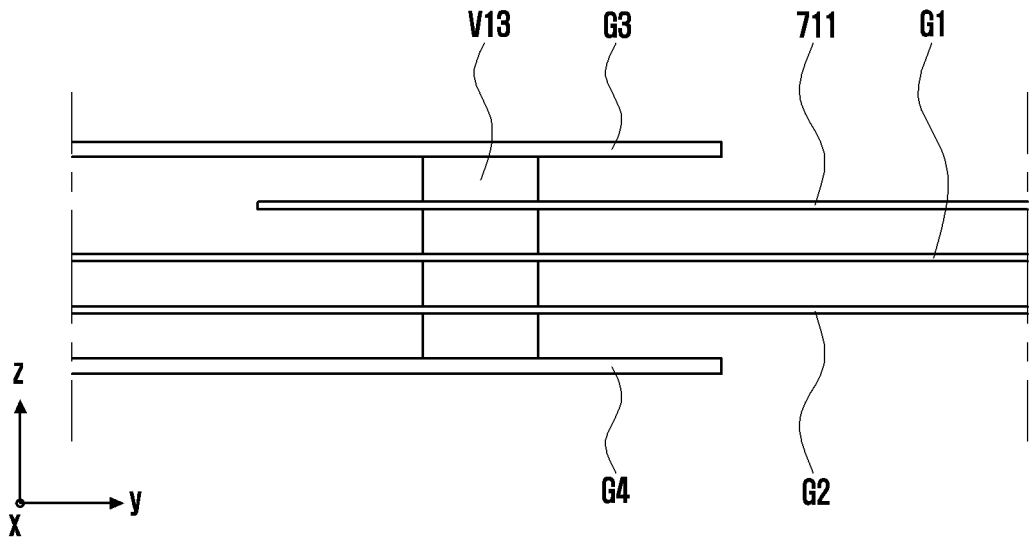
FIG. 12 is a side view of a part of a ground structure included in a circuit board at a portion indicated by reference numeral "D" in FIG. 6 according to an embodiment of the disclosure.

FIG. 7 illustrates a cross-sectional structure 700 of a part of a circuit board 6 taken along line A-A' in FIG. 6 according to an embodiment of the disclosure. FIG. 8 illustrates a cross-sectional structure 800 of a part of a circuit board 6 including at least one first conductive via V11 implemented as an LVH, as another embodiment modified from the embodiment of FIG. 7 according to an embodiment of the disclosure. FIG. 9 illustrates a cross-sectional structure 900 of a part of a circuit board 6 including at least one fourth conductive via V14 implemented as an LVH, as another embodiment modified from the embodiment of FIG. 7 according to an embodiment of the disclosure. FIG. 10 illustrates a cross-sectional structure of a coverlay film 1000 having an electromagnetic shielding property according to an embodiment of the disclosure. FIG. 11 is a perspective view of a part of a ground structure 750 included in a circuit board 6 at a portion indicated by reference numeral "D" in FIG. 6 according to an embodiment of the disclosure. FIG. 12 is a side view of a part of a ground structure 750 included in a circuit board 6 at a portion indicated by reference numeral "D" in FIG. 6 according to an embodiment of the disclosure.

Referring to FIG. 7, in an embodiment of the disclosure, the first portion 61 of the circuit board 6 may include a first surface 601 and a second surface 602 which are positioned at sides opposite to each other. The second portion 62 of the circuit board 6 may include a third surface 603 and a fourth surface 604 which are positioned at sides opposite to each other. The third portion 63 of the circuit board 6 may include a fifth surface 605 and a sixth surface 606 which are positioned at sides opposite to each other. For example, the first surface 601, the third surface 603, and the fifth surface 605 may be oriented in substantially the same direction. For example, the second surface 602, the fourth surface 604, and the sixth surface 606 may be oriented in substantially the same direction. In an embodiment of the disclosure, the first portion 61 of the circuit board 6 may have a first thickness T1, and the second portion 62 of the circuit board 6 may have a second thickness T2 greater than the first thickness T1. The third portion 63 of the circuit board 6 may have a third thickness T3 greater than the first thickness T1. The second thickness T2 and the third thickness T3 may be substantially identical. In some embodiments of the disclosure, the second thickness T2 and third thickness T3 may be different. The number of conductive layers stacked on the first portion 61 of the circuit board 6 may be smaller than those in the second portion 62 and/or the third portion 63 of the circuit board 6. In an embodiment of the disclosure, the third surface 603 or the fifth surface 605 may be positioned to protrude with respect to the first surface 601, and the fourth surface 604 or the sixth surface 606 may be positioned to protrude with respect to the second surface 602.

According to an embodiment of the disclosure, the circuit board 6 may include a first conductive layer 701, a second conductive layer 702, a third conductive layer 703, a fourth conductive layer 704, a fifth conductive layer 705, a sixth conductive layer 706, or a seventh conductive layer 711. The third conductive layer 703 and the fourth conductive layer 704 may be positioned in the second portion 62 of the circuit board 6. For example, among the conductive layers included in the second portion 62 of the circuit board 6, the third conductive layer 703 may be positioned closest to the third surface 603. For example, among the conductive layers included in the second portion 62 of the circuit board 6, the fourth conductive layer 704 may be positioned closest to the fourth surface 604. The fifth conductive layer 705 and the sixth conductive layer 706 may be positioned in the third portion 63 of the circuit board 6. For example, among the conductive layers included in the third portion 63 of the circuit board 6, the fifth conductive layer 705 may be positioned closest to the fifth surface 605. For example, among the conductive layers included in the third portion 63 of the circuit board 6, the sixth conductive layer 706 may be positioned closest to the sixth surface 606. A part of the first conductive layer 701 and/or a part of the second conductive layer 702 may be positioned in the first portion 61 of the circuit board 6. A part of the first conductive layer 701 and/or a part of the second conductive layer 702 may be positioned between the third conductive layer 703 and the fourth conductive layer 704 in the second portion 62 of the circuit board 6. A part of the first conductive layer 701 and/or a part of the second conductive layer 702 may be positioned between the fifth conductive layer 705 and the sixth conductive layer 706 in the third portion 63 of the circuit board 6. A part of the seventh conductive layer 711 may be positioned in the first portion 61 of the circuit board 6. A part of the seventh conductive layer 711 may be positioned between the first conductive layer 701 and the third conductive layer 703 in the second portion 62 of the circuit board 6. A part of the seventh conductive layer 711 may be positioned between the first conductive layer 701 and the fifth conductive layer 705 in the third portion 63 of the circuit board 6. The circuit board 6 may include a first dielectric D1 between the first conductive layer 701 and the second conductive layer 702. The circuit board 6 may include a second dielectric D2 between the first conductive layer 701 and the third conductive layer 703. The circuit board 6 may include a third dielectric D3 between the second conductive layer 702 and the fourth conductive layer 704. The circuit board 6 may include a fourth dielectric D4 between the first conductive layer 701 and the fifth conductive layer 705. The circuit board 6 may include a fifth dielectric D5 between the second conductive layer 702 and the sixth conductive layer 706. The first dielectric D1, the second dielectric D2, the third dielectric D3, the fourth dielectric D4, or the fifth dielectric D5 may include various insulation materials or non-conductive materials.

For example, at least a part of the circuit board 6 may be formed using a flexible copper clad laminate (FCCL). The flexible copper clad laminate may be a laminate used in a printed circuit, and may include a structure in which a copper foil is attached on one surface or both surfaces of an insulation film (or a dielectric film) having flexibility by using an adhesive material (e.g., an acrylic adhesive). For example, the insulation film having flexibility may include various non-conductive materials, such as a polyimide film or a polyester film. In an embodiment of the disclosure, the first conductive layer 701, the second conductive layer 702, and the first dielectric D1 may be formed using a flexible copper clad laminate. For example, by processing a flexible printed circuit board with a series of processing, such as circuit printing, etching, and resist peeling, the first conductive layer 701, the second conductive layer 702, and the first dielectric D1 may be formed. In an embodiment of the disclosure, the second dielectric D2 between first conductive layer 701 and third conductive layer 703 and/or the third dielectric D3 between the second conductive layer 702 and the fourth conductive layer 704 may contribute to making the second portion 62 of the circuit board 6 have rigid properties. In an embodiment of the disclosure, the fourth dielectric D4 between the first conductive layer 701 and the fifth conductive layer 705 and/or the fifth dielectric D5 between the second conductive layer 702 and the sixth conductive layer 706 may contribute to making the third portion 63 of the circuit board 6 have rigid properties. For example, the second dielectric D2, the third dielectric D3, the fourth dielectric D4, and/or the fifth dielectric D5 may include various preimpregnated materials (PREPREGs) (e.g., an insulating resin layer). For example, the PREPREG may be a material in which liquid synthetic resin is impregnated into a fiber reinforcing agent (e.g., a reinforcing substrate), such as carbon fiber or glass fiber. In another embodiment of the disclosure, a dielectric (e.g., the second dielectric D2, the third dielectric D3, the fourth dielectric D4, and/or the fifth dielectric D5) may further include a reinforcing substrate, such as paper or glass nonwoven fabric, and the reinforcing substrate may increase the stiffness (e.g., the stiffness in the longitudinal and transverse direction) of a dielectric (e.g., the second dielectric D2, the third dielectric D3, the fourth dielectric D4, and/or the fifth dielectric D5), which is insufficient only with a resin, or may reduce the rate of dimensional change with respect to temperature. For another example, the PREPREG may include a thermosetting resin-based material, such as phenol resin or epoxy resin, and a thermoplastic resin-based material, such as polyetherketone. In some embodiments of the disclosure, the PREPREG may include a unidirectional PREPREG and a cross PREPREG.

For example, the circuit board 6 may include at least one signal line. In an embodiment of the disclosure, the at least one signal line may include at least one first signal line pattern S1 included in the first conductive layer 701, at least one second signal line pattern S3 included in the third conductive layer 703, at least one third signal line pattern S4 included in the fourth conductive layer 704, at least one fourth signal line pattern S5 included in the fifth conductive layer 705, and/or at least one fifth signal line pattern S6 included in the sixth conductive layer 706. The at least one signal line may include at least one first conductive via V11 for electrically connecting the at least one first signal line pattern S1, the at least one second signal line pattern S3, and the at least one third signal line pattern S4. The at least one first conductive via V11 may be positioned in the second portion 62 of the circuit board 6. The at least one signal line may include at least one second conductive via V12 for electrically connecting at least one first signal line pattern S1, at least one fourth signal line pattern S5, and at least one fifth signal line pattern S6. The at least one second conductive via V12 may be positioned in the third portion 63 of the circuit board 6. In the illustrated example, the at least one first conductive via V11 and/or the at least one second conductive via V12 may include a PTH. In some embodiments of the disclosure, according to the shape or the position of signal line patterns, the at least one first conductive via V11 or the at least one second conductive via V12 may also be implemented as an LVH, a BVH, or a stacked via. Referring to FIG. 8, the at least one first conductive via V11 may be implemented as an LVH, and for example, may electrically connect the at least one first signal line pattern S1 and the at least one third signal line pattern S3. Although not illustrated therein, the at least one second conductive via V12 illustrated in FIG. 7 may be implemented as an LVH formed in the same manner as the at least one first conductive via V11 illustrated in FIG. 8. In some embodiments of the disclosure, according to the shape or the position of signal line patterns, the at least one first conductive via V11 or the at least one second conductive via V12 may also be positioned in the first portion 61.

For example, the circuit board 6 may include a ground structure (or an electromagnetic shielding structure) 750 to reduce electromagnetic influence (e.g., electromagnetic interference (EMI)) on at least one signal line. Referring to FIGS. 7, 9, and 10, in an embodiment of the disclosure, the ground structure 750 may include at least one first ground pattern G1 included in the first conductive layer 701, at least one second ground pattern G2 included in the second conductive layer 702, at least one third ground pattern G3 included in the third conductive layer 703, at least one fourth ground pattern G4 included in the fourth conductive layer 704, at least one fifth ground pattern G5 included in the fifth conductive layer 705, and/or at least one sixth ground pattern G6 included in the sixth conductive layer 706. The ground structure 750 may include a seventh conductive layer 711. The ground structure 750 may include at least one third conductive via V13 for electrically connecting the at least one first ground pattern G1, the at least one second ground pattern G2, the at least one third ground pattern G3, the at least one fourth ground pattern G4, and the seventh conductive layer 711. The at least one third conductive via V13 may be positioned in the second portion 62 of the circuit board 6. The ground structure 750 may include at least one fourth conductive via V14 for electrically connecting the at least one first ground pattern G1, the at least one second ground pattern G2, the at least one fifth ground pattern G5, the at least one sixth ground pattern G6, and the seventh conductive layer 711. The at least one fourth conductive via V14 may be positioned in the third portion 63 of the circuit board 6. The at least one third conductive via V13 and/or the at least one fourth conductive via V14 may include a PTH. In the portion indicated by reference numeral "E" in FIG. 6, a part of the ground structure 750 included in the circuit board 6 may be implemented to be substantially identical or similar to the illustrated example in FIGS. 9 and 10. In some implementations, according to the shape or the position of ground patterns, the at least one third conductive via V13 or the at least one fourth conductive via V14 may also be implemented as an LVH or a stacked via. Referring to FIG. 9, the at least one fourth conductive via V14 may be implemented as an LVH, and for example, may electrically connect the at least one first ground pattern G1, the at least one second ground pattern G2, the at least one fifth ground pattern G5, and the seventh conductive layer 711. Although not illustrated therein, the at least one third conductive via V13 illustrated in FIG. 7 may be implemented as an LVH formed in the same manner as the at least one fourth conductive via V14 illustrated in FIG. 9. In some embodiments of the disclosure, according to the shape or the position of ground patterns, the at least one third conductive via V13 or the at least one fourth conductive via V14 may also be positioned in the first portion 61. The ground structure 750 may not be short-circuited with (e.g., physically separated from) at least one signal line, and thus the signal or power delivered through the at least one signal line may be maintained. For example, the ground structure 750 may reduce electromagnetic interference between multiple signal lines. For example, the ground structure 750 may reduce influence (e.g., signal loss or signal transformation) of electromagnetic noise (e.g., EMI), which is generated inside the electronic device 2 (see FIG. 2) or introduced from the outside of the electronic device 2, on a signal delivered through the at least one signal line included in the circuit board 6. For example, the ground structure 750 may reduce influence of electromagnetic fields, which are generated when a current flows through the at least one signal line, on electrical elements around the circuit board 6.

For example, the circuit board 6 may include one or more surface protective layers. The surface protective layer may function to protect a circuit (or a circuit pattern) of the circuit board 6, and for example, may include an insulation layer or a non-conductive layer. In an embodiment of the disclosure, the circuit board 6 may include a first surface protective layer 710 forming at least a part of the first surface 601, a second surface protective layer 720 forming at least a part of the second surface 602, a third surface protective layer 730 forming at least a part of the third surface 603, a fourth surface protective layer 740 forming at least part of the fourth surface 604, a fifth surface protective layer 750 forming at least a part of the fifth surface 605, and/or a sixth surface protective layer 760 forming at least a part of the sixth surface 606.

According to an embodiment of the disclosure, the first surface protective layer 710 may include a first area 710a positioned in the first portion 61 of the circuit board 6, a second area 710b positioned in the second portion 62 of the circuit board 6, and a third area 710c positioned in the third portion 63 of the circuit board 6. The second area 710b may extend at least partially from the first area 710a between the first conductive layer 701 and the third conductive layer 703. The third area 710c may extend at least partially from the first area 710a between the first conductive layer 701 and the fifth conductive layer 705.

According to an embodiment of the disclosure, the first surface protective layer 710 may include a coverlay including an electromagnetic shielding material (or an electromagnetic shielding component, an electromagnetic shielding ingredient, an electromagnetic shielding constituent, an electromagnetic shielding characteristic, or an electromagnetic shielding property). The first surface protective layer 710 may include multiple layers, and a part of the multiple layers may include a conductive layer (e.g., the seventh conductive layer 711) capable of shielding electromagnetic waves. In the illustrated example, for example, the first surface protective layer 710 including an electromagnetic shielding material (or an electromagnetic shielding component, an electromagnetic shielding ingredient, an electromagnetic shielding constituent, an electromagnetic shielding characteristic, or an electromagnetic shielding property) may reduce the influence of external electromagnetic noise, which is applied toward the first surface 601, on at least one first signal line pattern S1. For example, the first surface protective layer 710 including an electromagnetic shielding material (or an electromagnetic shielding component, an electromagnetic shielding ingredient, an electromagnetic shielding constituent, an electromagnetic shielding characteristic, or an electromagnetic shielding property) may reduce the influence of electromagnetic fields, which are generated when a current flows through the at least one first signal line pattern S1, on electrical elements around the circuit board 6. For example, the first surface protective layer 710 may include a seventh conductive layer 711, a first insulation layer (or a first non-conductive layer) 712, a second insulation layer (or a second non-conductive layer) 713, and/or a non-conductive adhesive layer 714. The seventh conductive layer 711 may be positioned between the first insulation layer 712 and the second insulation layer 713. The second insulation layer 713 may be positioned between the seventh conductive layer 711 and the non-conductive adhesive layer 714. The non-conductive adhesive layer 714 may be positioned between the first conductive layer 701 and the second insulation layer 713, and the first surface protective layer 710 may be coupled (e.g., bonded) to the first conductive layer 701 by using the non-conductive adhesive layer 714. For example, the seventh conductive layer 711 may include various conductive materials, such as copper, having shielding properties capable of reducing electromagnetic interference. For example, the first insulation layer 712 and/or the second insulation layer 713 may include various flexible polymers, such as polyimide. For example, the non-conductive adhesive layer 714 may include an acryl-based or epoxy-based material. In some embodiments of the disclosure, various adhesive materials may be positioned between the seventh conductive layer 711 and the first insulation layer 712 and/or between the seventh conductive layer 711 and the second insulation layer 713.

According to an embodiment of the disclosure, the first surface protective layer 710 may be formed using a coverlay film 1000 (see FIG. 10) having electromagnetic shielding properties (or electromagnetic wave shielding properties) or an electromagnetic shielding material (or an electromagnetic shielding component, an electromagnetic shielding ingredient, an electromagnetic shielding constituent, an electromagnetic shielding characteristic, or an electromagnetic shielding property). Referring to FIG. 10, the coverlay film 1000 may include a conductive layer 1010, a first non-conductive layer 1020, a second non-conductive layer 1030, a non-conductive adhesive layer 1040, or a release layer 1050. The seventh conductive layer 711 of the first surface protective layer 710 may be formed based on the conductive layer 1010 of the coverlay film 1000. The first insulation layer 712 of the first surface protective layer 710 may be formed based on the first non-conductive layer 1020 of the coverlay film 1000. The second insulation layer 713 of the first surface protective layer 710 may be formed based on the second non-conductive layer 1030 of the coverlay film 1000. The non-conductive adhesive layer 714 of the first surface protective layer 710 may be formed based on the non-conductive adhesive layer 1040 of the coverlay film 1000. The release layer 1050 may be detachably disposed on the non-conductive adhesive layer 1040 in order to protect the non-conductive adhesive layer 1030. Through an operation of processing the outer shape of the coverlay film 1000 to correspond to the shape of the circuit board 6 and an operation of separating the release layer 1050, the first surface protective layer 710 may be formed, and the first surface protective layer 710 may be coupled to the first conductive layer 701 by using a non-conductive adhesive layer 714. In some embodiments of the disclosure, the non-conductive adhesive layer 1040 and the release layer 1050 of the coverlay film 1000 may be omitted, and in this case, the non-conductive adhesive layer 714 of the circuit board 6 may be implemented separately from the first surface protective layer 710. In some embodiments of the disclosure, the coverlay film 1000 is not limited to the illustrated example, and may be implemented in a form including multiple conductive layers stacked in a direction from the first non-conductive layer 1010 to the second non-conductive layer 1020, between the first non-conductive layer 1010 and the second non-conductive layer 1020. In this case, a non-conductive adhesive material or a conductive adhesive material may be positioned between the multiple conductive layers. The second area 710b or the third area 710c of the first surface protective layer 710 is not limited to the illustrated example in FIG. 7, and may be further expanded. The seventh conductive layer 711 of the first surface protective layer 710 included in the ground structure 750 may be disposed to avoid the at least one first conductive via V11 so as not to conduct electricity with the at least one first conductive via V11. The seventh conductive layer 711 of the first surface protective layer 710 included in the ground structure 750 may be disposed to avoid the at least one second conductive via V12 so as not to conduct electricity with the at least one second conductive via V12.

The elements included in the first surface protective layer 710 may have various thicknesses. At least two of the first insulation layer 711, the seventh conductive layer 712, the second insulation layer 713, and the non-conductive adhesive layer 714 may have different thicknesses. In some embodiments of the disclosure, at least two of the first insulation layer 711, the seventh conductive layer 712, the second insulation layer 713, and the non-conductive adhesive layer 714 may have substantially the same thickness. In an embodiment of the disclosure, the seventh conductive layer 711 may have a thickness thinner than the first insulation layer 711, the second insulation layer 713, or the non-conductive adhesive layer 714. In an embodiment of the disclosure, the second insulation layer 713 may have a thickness greater than the first insulation layer 712. For example, the seventh conductive layer 711 may have a thickness (e.g., about 7 μm) of about 10 μm (micrometer) or less. For example, the first insulation layer 712 may have a thickness (e.g., about 8 μm) of about 10 μm or less. For example, the second insulation layer 713 may have a thickness (e.g., about 20 μm) of about 25 μm or less. For example, the non-conductive adhesive layer 714 may have a thickness (e.g., about 15 μm) of about 20 μm or less. The seventh conductive layer 711, the first insulation layer 712, the second insulation layer 713, or the non-conductive adhesive layer 714 may have various other thicknesses. In an embodiment of the disclosure, the first surface protective layer 710 may have a thickness (e.g., about 50 μm) of about 100 μm or less.

The second surface protective layer 720 (e.g., a second coverlay) may include a first area 720a positioned in the first portion 61 of the circuit board 6, a second area 720b extending from the first area 720a to the second portion 62 of the circuit board 6, and/or a third area 720c extending from the first area 720a to the third portion 63 of the circuit board 6. The second area 720b may be positioned between the second conductive layer 702 and the fourth conductive layer 704, and the third area 720c may be positioned between the second conductive layer 702 and the sixth conductive layer 706. In some embodiments of the disclosure, the second area 720b may be positioned in a part between the second conductive layer 702 and the fourth conductive layer 704, or the third area 720c may be positioned in a part between the second conductive layer 702 and the sixth conductive layer 706. In some embodiments of the disclosure, the second area 720b and/or the third area 720c may be omitted. For example, the second surface protective layer 720 may include various insulation materials, such as a solder mask insulating ink (e.g., a photo imageable solder resist mask (PSR) ink) having an epoxy (or an epoxy material or an epoxy component). Various non-conductive adhesive layers 721 may be positioned between the second surface protective layer 720 and the second conductive layer 702. In some embodiments of the disclosure, the second surface protective layer 720 may include an adhesive (or an adhesive material or an adhesive component), and in this case, the non-conductive adhesive layers 721 may be omitted. The third surface protective layer 730 may cover at least a part of the third conductive layer 703. The fourth surface protective layer 740 may cover at least a part of the fourth conductive layer 704. The fifth surface protective layer 750 may cover at least a part of the fifth conductive layer 705. The sixth surface protective layer 760 may cover at least a part of the sixth conductive layer 706. For example, the third surface protective layer 730, the fourth surface protective layer 740, the fifth surface protective layer 750, and/or the sixth surface protective layer 760 may include various insulation materials, such as a solder mask insulating ink.

The cross-sectional structure 700 of the circuit board 6 illustrated in FIG. 7 may be merely an example, and various circuit boards including a flexible portion and a rigid portion, or portions having different flexibility may be implemented including a coverlay formed using the coverlay film 1000 (see FIG. 10) having electromagnetic shielding properties. In some embodiments of the disclosure, at least one of the elements illustrated in FIG. 7 may be omitted from the circuit board 6, or one or more other elements may be added therein.

Figure 13:
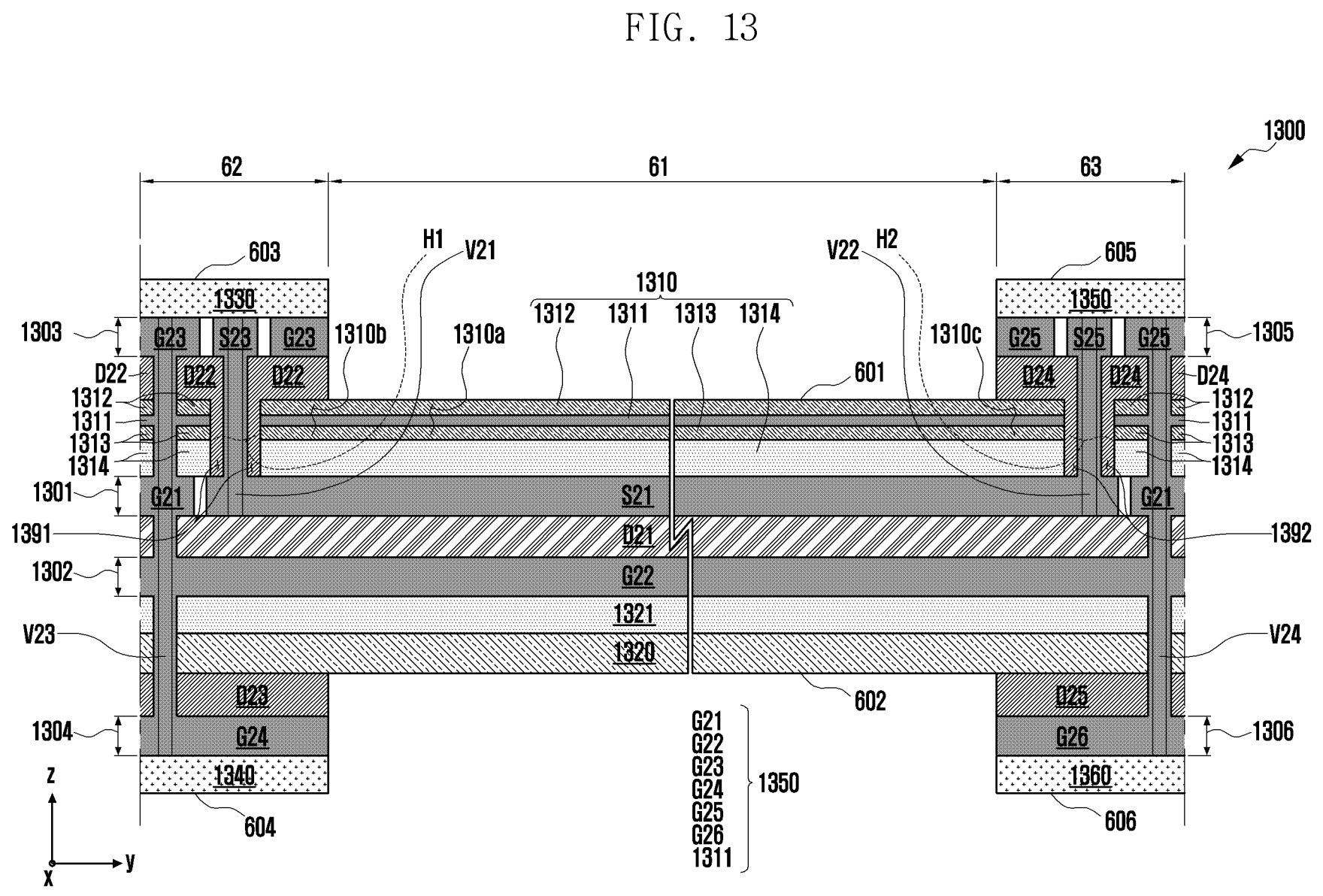

FIG. 13 illustrates a cross-sectional structure 1300 of a part of a circuit board 6 taken along line A-A' in FIG. 6 according to an embodiment of the disclosure.

Referring to FIG. 13, for example, the circuit board 6 may include a first conductive layer 1301 (e.g., the first conductive layer 701 in FIG. 7), a second conductive layer 1302 (e.g., the second conductive layer 702 in FIG. 7), a third conductive layer 1303 (e.g., the third conductive layer 703 in FIG. 7), a fourth conductive layer 1304 (e.g., the fourth conductive layer 704 in FIG. 7), a fifth conductive layer 1305 (e.g., the fifth conductive layer 705 in FIG. 7), a sixth conductive layer 1306 (e.g., the sixth conductive layer 706 in FIG. 7), or a seventh conductive layer 1311 (e.g., the seventh conductive layer 711 in FIG. 7). The third conductive layer 1303 and the fourth conductive layer 1304 may be positioned in the second portion 62 of the circuit board 6. For example, among the conductive layers included in the second portion 62 of the circuit board 6, the third conductive layer 1303 may be positioned closest to the third surface 603. For example, among the conductive layers included in the second portion 62 of the circuit board 6, the fourth conductive layer 1304 may be positioned closest to the fourth surface 604. The fifth conductive layer 1305 and the sixth conductive layer 1306 may be positioned in the third portion 63 of the circuit board 6. For example, among the conductive layers included in the third portion 63 of the circuit board 6, the fifth conductive layer 1305 may be positioned closest to the fifth surface 605. For example, among the conductive layers included in the third portion 63 of the circuit board 6, the sixth conductive layer 1306 may be positioned closest to the sixth surface 606. A part of the first conductive layer 1301 and/or a part of the second conductive layer 1302 may be positioned in the first portion 61 of the circuit board 6. A part of the first conductive layer 1301 and/or a part of the second conductive layer 1302 may be positioned between the third conductive layer 1303 and the fourth conductive layer 1304 in the second portion 62 of the circuit board 6. A part of the first conductive layer 1301 and/or a part of the second conductive layer 1302 may be positioned between the fifth conductive layer 1305 and the sixth conductive layer 1306 in the third portion 63 of the circuit board 6. A part of the seventh conductive layer 1311 may be positioned in the first portion 61 of the circuit board 6. A part of the seventh conductive layer 1311 may be positioned between the first conductive layer 1301 and the third conductive layer 1303 in the second portion 62 of the circuit board 6. A part of the seventh conductive layer 1311 may be positioned between the first conductive layer 1301 and the fifth conductive layer 1305 in the third portion 63 of the circuit board 6. The circuit board 6 may include a first dielectric D21 (e.g., the first dielectric D1 in FIG. 7) between the first conductive layer 1301 and the second conductive layer 1302. The circuit board 6 may include a second dielectric D22 (e.g., the second dielectric D2 in FIG. 7) between the first conductive layer 1301 and the third conductive layer 1303. The circuit board 6 may include a third dielectric D23 (e.g., the third dielectric D3 in FIG. 7) between the second conductive layer 1302 and the fourth conductive layer 1304. The circuit board 6 may include a fourth dielectric D24 (e.g., the fourth dielectric D4 in FIG. 7) between the first conductive layer 1301 and the fifth conductive layer 1305. The circuit board 6 may include a fifth dielectric D25 (e.g., the fifth dielectric D5 in FIG. 7) between the second conductive layer 1302 and the sixth conductive layer 1306. The first dielectric D21, the second dielectric D22, the third dielectric D23, the fourth dielectric D24, or the fifth dielectric D25 may include various insulation materials or non-conductive materials.

For example, the first conductive layer 1301, the second conductive layer 1302, and the first dielectric D21 may be formed using a flexible copper clad laminate. The second dielectric D22 between first conductive layer 1301 and third conductive layer 1303 and/or the third dielectric D23 between the second conductive layer 1302 and the fourth conductive layer 1304 may contribute to making the second portion 62 of the circuit board 6 have rigid properties. The fourth dielectric D24 between the first conductive layer 1301 and the fifth conductive layer 1305 and/or the fifth dielectric D25 between the second conductive layer 1302 and the sixth conductive layer 1306 may contribute to making the third portion 63 of the circuit board 6 have rigid properties. For example, the second dielectric D22, the third dielectric D23, the fourth dielectric D24, and/or the fifth dielectric D25 may include various PREPREGs.

For example, the circuit board 6 may include at least one signal line. In an embodiment of the disclosure, at least one signal line may include at least one first signal line pattern S21 included in the first conductive layer 1301, at least one second signal line pattern S23 included in the third conductive layer 1303, and/or at least one third signal line pattern S25 included in the fifth conductive layer 1305. At least one signal line may include at least one first conductive via V21 for electrically connecting the at least one first signal line pattern S21 and the at least one second signal line pattern S23. The at least one first conductive via V21 may be positioned in the second portion 62. At least one signal line may include at least one second conductive via V22 for electrically connecting the at least one first signal line pattern S21 and the at least one fifth signal line pattern S25. The at least one second conductive via V22 may be positioned in the third portion 63 of the circuit board 6. The at least one first conductive via V21 and/or the at least one second conductive via V22 may include an LVH. In some implementations, according to the shape or the position of signal line patterns, the at least one first conductive via V21 or the at least one second conductive via V22 may also be implemented as a PTH, a BVH, or a stacked via. In some embodiments of the disclosure, according to the shape or the position of signal line patterns included in a signal line, the at least one first conductive via V21 or the at least one second conductive via V22 may also be positioned in the first portion 61.

For example, the circuit board 6 may include a ground structure 1350, which is an electromagnetic shielding structure, to reduce electromagnetic influence (e.g., electromagnetic interference (EMI)) on the at least one signal line. In an embodiment of the disclosure, the ground structure 1350 may include at least one first ground pattern G21 (e.g., the at least one first ground pattern G1 in FIG. 7) included in the first conductive layer 1301, at least one second ground pattern G22 (e.g., the at least one second ground pattern G2 in FIG. 7) included in the second conductive layer 1302, at least one third ground pattern G23 (e.g., the at least one third ground pattern G3 in FIG. 7) included in the third conductive layer 1303, at least one fourth ground pattern G24 (e.g., the at least one fourth ground pattern G4 in FIG. 7) included in the fourth conductive layer 1304, at least one fifth ground pattern G25 (e.g., the at least one fifth ground pattern G5 in FIG. 7) included in the fifth conductive layer 1305, and/or at least one sixth ground pattern G26 (e.g., the at least one sixth ground pattern G6 in FIG. 7) included in the sixth conductive layer 1306. The ground structure 1350 may include a seventh conductive layer 1311 (e.g., the seventh conductive layer 711 in FIG. 7). The ground structure 1350 may include at least one third conductive via V23 (e.g., the at least one third conductive via V13 in FIG. 7) for electrically connecting the at least one first ground pattern G21, the at least one second ground pattern G22, the at least one third ground pattern G23, the at least one fourth ground pattern G24, and the seventh conductive layer 1311. The at least one third conductive via V23 may be positioned in the second portion 62 of the circuit board 6. The ground structure 1350 may include at least one fourth conductive via V24 (e.g., the at least one fourth conductive via V14 in FIG. 7) for electrically connecting the at least one first ground pattern G21, the at least one second ground pattern G22, the at least one fifth ground pattern G25, the at least one sixth ground pattern G26, and the seventh conductive layer 1311. The at least one fourth conductive via V24 may be positioned in the third portion 63 of the circuit board 6. The at least one third conductive via V23 and/or the at least one fourth conductive via V24 may include a PTH. In some embodiments of the disclosure, the at least one third conductive via V23 or the at least one fourth conductive via V24 may be implemented as an LVH formed in the same manner as the at least one fourth conductive via V14 illustrated in FIG. 9. The ground structure 1350 may not be short-circuited with at least one signal line, and thus the signal or power delivered through the at least one signal line may be maintained. The ground structure 1350 may reduce electromagnetic interference between multiple signal lines. For example, the ground structure 1350 may reduce influence (e.g., signal loss or signal transformation) of electromagnetic noise (e.g., EMI), which is generated inside the electronic device 2 (see FIG. 2) or introduced from the outside of the electronic device 2, on a signal delivered through the at least one signal line included in the circuit board 6. For example, the ground structure 1350 may reduce influence of electromagnetic fields, which are generated when a current flows through the at least one signal line, on electrical elements around the circuit board 6.

For example, the circuit board 6 may include one or more surface protective layers which is an insulation layer for circuit protection. In an embodiment of the disclosure, the circuit board 6 may include a first surface protective layer 1310 forming at least a part of the first surface 601, a second surface protective layer 1320 forming at least a part of the second surface 602, a third surface protective layer 1330 forming at least a part of the third surface 603, a fourth surface protective layer 1340 forming at least part of the fourth surface 604, a fifth surface protective layer 1350 forming at least a part of the fifth surface 605, and/or a sixth surface protective layer 1360 forming at least a part of the sixth surface 606. The second surface protective layer 1320 may be substantially the same as the second surface protective layer 720 in FIG. 7. The third surface protective layer 1330 may be substantially the same as the third surface protective layer 730 in FIG. 7. The fourth surface protective layer 1340 may be substantially the same as the fourth surface protective layer 740 in FIG. 7. The fifth surface protective layer 1350 may be substantially the same as the fifth surface protective layer 750 in FIG. 7. The sixth surface protective layer 1360 may be substantially the same as the sixth surface protective layer 760 in FIG. 7.

According to an embodiment of the disclosure, the first surface protective layer 1310 may include a first area 1310*a* positioned in the first portion 61 of the circuit board 6, a second area 1310*b* positioned in the second portion 62 of the circuit board 6, and a third area 1310*c* positioned in the third portion 63 of the circuit board 6. The second area 1310*b* may extend from the first area 1310*a* between the first conductive layer 1301 and the third conductive layer 1303. The third area 1310*c* may extend from the first area 1310*a* between the first conductive layer 1301 and the fifth conductive layer 1305. In an embodiment of the disclosure, the first surface protective layer 1310 may be formed using the coverlay film 1000 (see FIG. 10) having electromagnetic shielding properties, and for example, may include the seventh conductive layer 1311 (e.g., the seventh conductive layer 711 in FIG. 7), a first insulation layer 1312 (e.g., the first insulation layer 712 in FIG. 7), a second insulation layer 1313 (e.g., the second insulation layer 713 in FIG. 7), and/or a non-conductive adhesive layer 1314 (e.g., the non-conductive adhesive layer 714 in FIG. 7).

According to an embodiment of the disclosure, the second area 1310*b* of the first surface protective layer 1310 may be disposed to avoid the at least one first conductive via V21 so that the seventh conductive layer 1311 included in the ground structure 1350 does not conduct electricity with the at least one first conductive via V21. The third 1310*c* of the first surface protective layer 1310 may be disposed to avoid the at least one second conductive via V22 so that the seventh conductive layer 1311 included in the ground structure 1350 does not conduct electricity with the at least one second conductive via V22.

According to an embodiment of the disclosure, the first surface protective layer 1310 may include a first hole H1 through which the first conductive via V21 extends. A first non-conductive member 1391 including the same material as or a different material from the second dielectric D22 may be positioned (filled) between the first conductive via V21 and the first hole H1. In some embodiments of the disclosure, the first non-conductive member 1391 may be a portion extending from the second dielectric D22. By the first non-conductive member 1391, the seventh conductive layer 1311 may be physically separated from the first conductive via V21 included in at least one signal line. The first surface protective layer 1310 may include a second hole H2 through which the second conductive via V22 extends. A second non-conductive member 1392 including the same material as or a different material from the fourth dielectric D24 may be positioned (filled) between the second conductive via V22 and the second hole H2. In some embodiments of the disclosure, the second non-conductive member 1392 may be a portion extending from the fourth dielectric D24. By the second non-conductive member 1392, the seventh conductive layer 1311 may be physically separated from the second conductive via V22 included in at least one signal line.

According to an embodiment of the disclosure, the circuit board 6 may be manufactured by a manufacturing method in which an operation, in which two layers pairing up each other are stacked both sides thereof with reference to a central substrate (e.g., the first dielectric D21), respectively, is performed several times. For example, the manufacturing method may prevent damage, such as bending or tearing of the circuit board 6 due to environments, such as temperature or pressure applied during manufacturing. For example, the first conductive layer 1301 and the second conductive layer 1302 may be positioned to pair up each other with reference to the first dielectric D21. For example, the third conductive layer 1303 and the fourth conductive layer 1304 may be positioned to pair up each other with reference to the first dielectric D21. For example, the fifth conductive layer 1305 and the sixth conductive layer 1306 may be positioned to pair up each other with reference to the first dielectric D21. For example, the second dielectric D22 and the third dielectric D23 may be positioned to pair up each other with reference to the first dielectric D21. For example, the fourth dielectric D24 and the fifth dielectric D25 may be positioned to pair up each other with reference to the first dielectric D21. For example, a layer including a non-conductive adhesive layer 1321 and the second surface protective layer 1320, and the first surface protective layer 1310 may be positioned to pair up each other with reference to the first dielectric D21.

The cross-sectional structure 1300 of the circuit board 6 illustrated in FIG. 13 may be merely an example, and various circuit boards including a flexible portion and a rigid portion, or portions having different flexibility may be implemented including a coverlay formed using the coverlay film 1000 (see FIG. 10) having electromagnetic shielding properties. In some embodiments of the disclosure, at least one of the elements illustrated in FIG. 13 may be omitted from the circuit board 6, or one or more other elements may be added therein.

FIGS. 14A, 14B, 14C, 14D, and 14E are cross-sectional views showing an operation flow of forming at least one first conductive via V21 in FIG. 13 according to various embodiments of the disclosure.

Figure 14A:
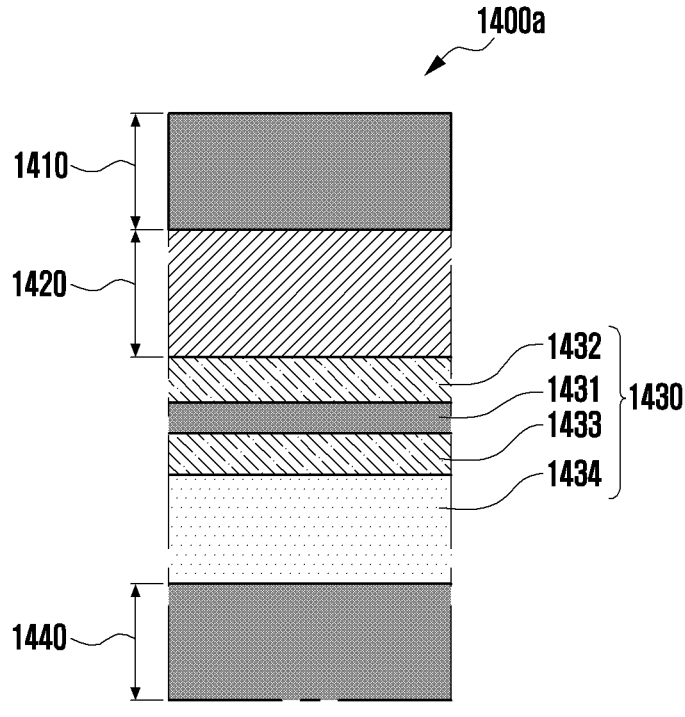
FIGS. 14A, 14B, 14C, 14D, and 14E are cross-sectional views showing an operation flow of forming at least one first conductive via in FIG. 13 according to various embodiments of the disclosure.

Referring to FIG. 14A, a first lamination structure 1400*a* may include a conductive layer 1410 which is the basis for forming the third conductive layer 1303 in FIG. 13, an insulation layer 1420 which is the basis for forming the second dielectric D22 in FIG. 13, a coverlay 1430 which is the basis for forming the first surface protective layer 1310 in FIG. 13, and another conductive layer 1440 which is the basis for forming the first conductive layer 1301 in FIG. 13.

The coverlay 1430 may be formed using the coverlay film 1000 (see FIG. 10) having electromagnetic shielding properties, and for example, may include a conductive layer 1431, a first insulation layer 1432, a second insulation layer 1433, and a non-conductive adhesive layer 1434.

Figure 14B:
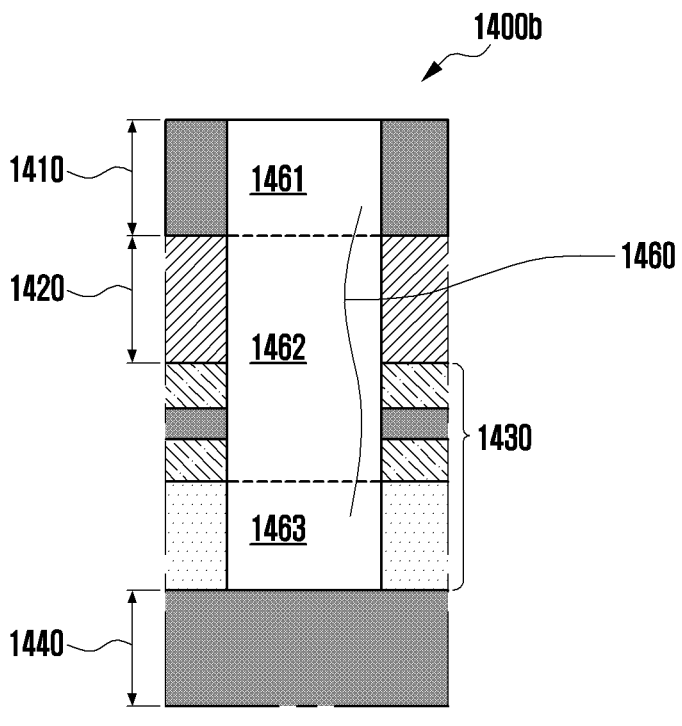

Referring to FIGS. 14A and 14B, in an embodiment of the disclosure, a second lamination structure 1400b including a hole structure 1460 passing through the conductive layer 1410, the insulation layer 1420, and the coverlay 1430 may be formed. The hole structure 1460 may include a first hole 1461 included in the conductive layer 1410, a second hole 1462 included in the insulation layer 1420, and a third hole 1463 included in the coverlay 1430. In an embodiment of the disclosure, the hole structure 1460 may be formed by drilling at least an area of the first lamination structure 1400a. Drilling may be merely an example of a processing method for forming the hole structure 1460, and according to another embodiment of the disclosure, the hole structure 1460 may be formed using laser processing or punching processing.

Figure 14C:
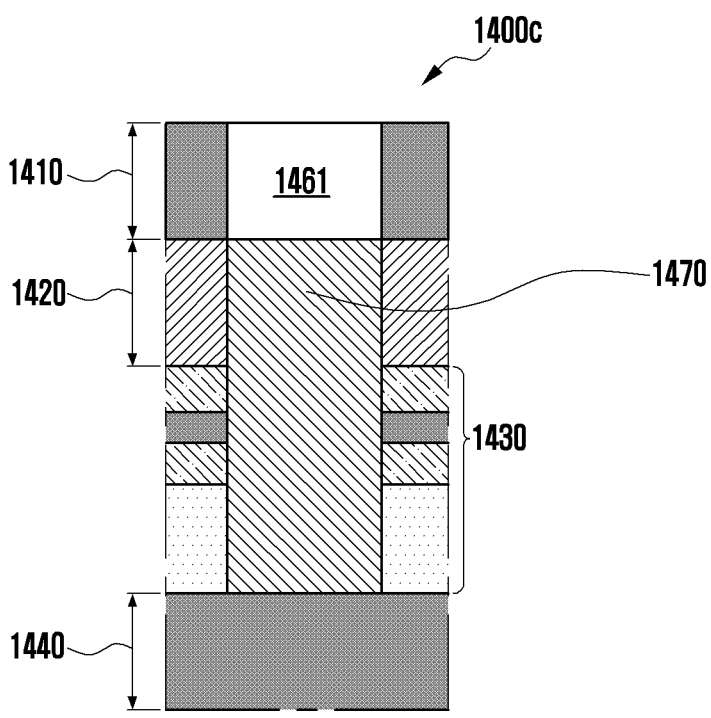

Referring to FIGS. 14B and 14C, in an embodiment of the disclosure, a third lamination structure 1400c including a non-conductive member 1470 may be formed by filling the second hole 1462 and the third hole 1463 with a non-conductive material. The non-conductive member 1470 may include the same material as the insulation layer 1420. In some embodiments of the disclosure, the non-conductive member 1470 may include a material different from the insulation layer 1420.

Figure 14D:
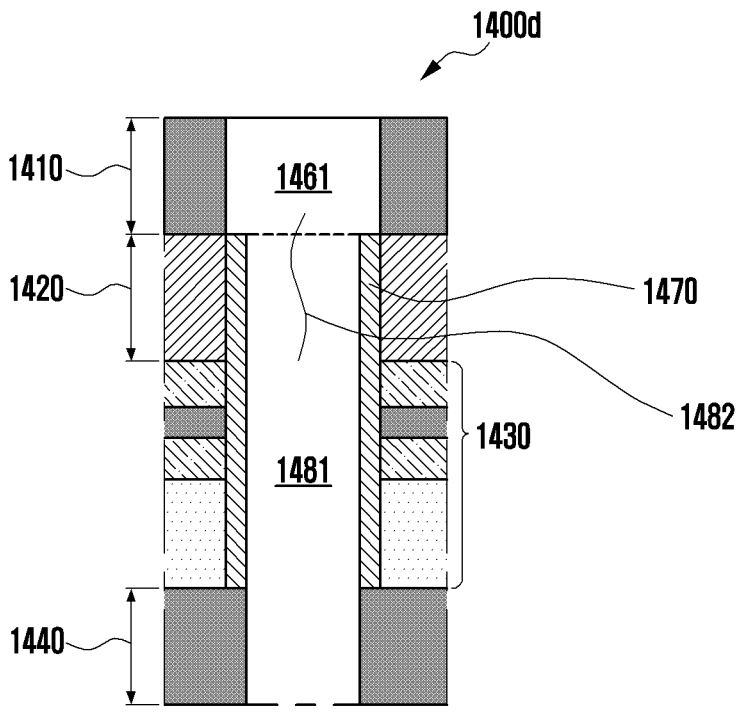

Referring to FIGS. 14C and 14D, in an embodiment of the disclosure, a fourth lamination structure 1400d including a fourth hole 1481 passing through the non-conductive member 1470 and the conductive layer 1440 may be formed. The fourth lamination structure 1400d may include a hole structure 1482 including the first hole 1461 and the fourth hole 1481.

Figure 14E:
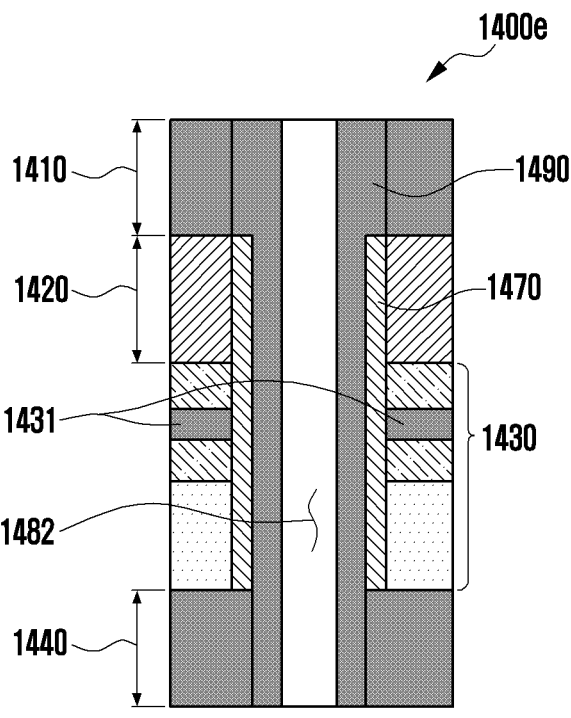

Referring to FIGS. 14D and 14E, in an embodiment of the disclosure, a fifth lamination structure 1400e including a conductive member 1490 formed by plating a conductive material (e.g., by plating copper (Cu)) on the hole structure 1482 may be formed. In an embodiment of the disclosure, the inside of the hole structure 1482 may be filled with a conductive material (or a "conductive substance") by using a hole plugging printed technology, and a method of filling the inside of the hole structure 1482 with a conductive material is not limited to the above-described embodiment. In an embodiment of the disclosure, the conductive material may be a material other than copper (Cu). For example, the conductive material may include at least one of silver paste, aluminum, silver-aluminum, carbon paste, or carbon nanotube (CNT) paste.

According to an embodiment of the disclosure, the conductive member 1490 may include the first conductive via V21 in FIG. 11, and for example, the two different conductive layers 1410 and 1440 may be electrically connected through a conductive member 1490. A part of the conductive member 1490 may be surrounded by the non-conductive member 1470 (e.g., the first non-conductive member 1391 in FIG. 13) in the hole structure 1482. The conductive layer 1431 (e.g., the seventh conductive layer 1311 in FIG. 11) of the coverlay 1430 may be physically separated from the conductive member 1490 (e.g., the first conductive via V21 in FIG. 11) by the non-conductive member 1470.

According to various embodiments of the disclosure, an electronic device including a circuit board (e.g., the circuit board 6 in FIG. 6) including a flexible portion and a rigid portion, or portions having different flexibility is not limited to the embodiment of FIG. 2, and may be variously implemented. For example, there may be an electronic device having an expandable screen.

Figure 15A:
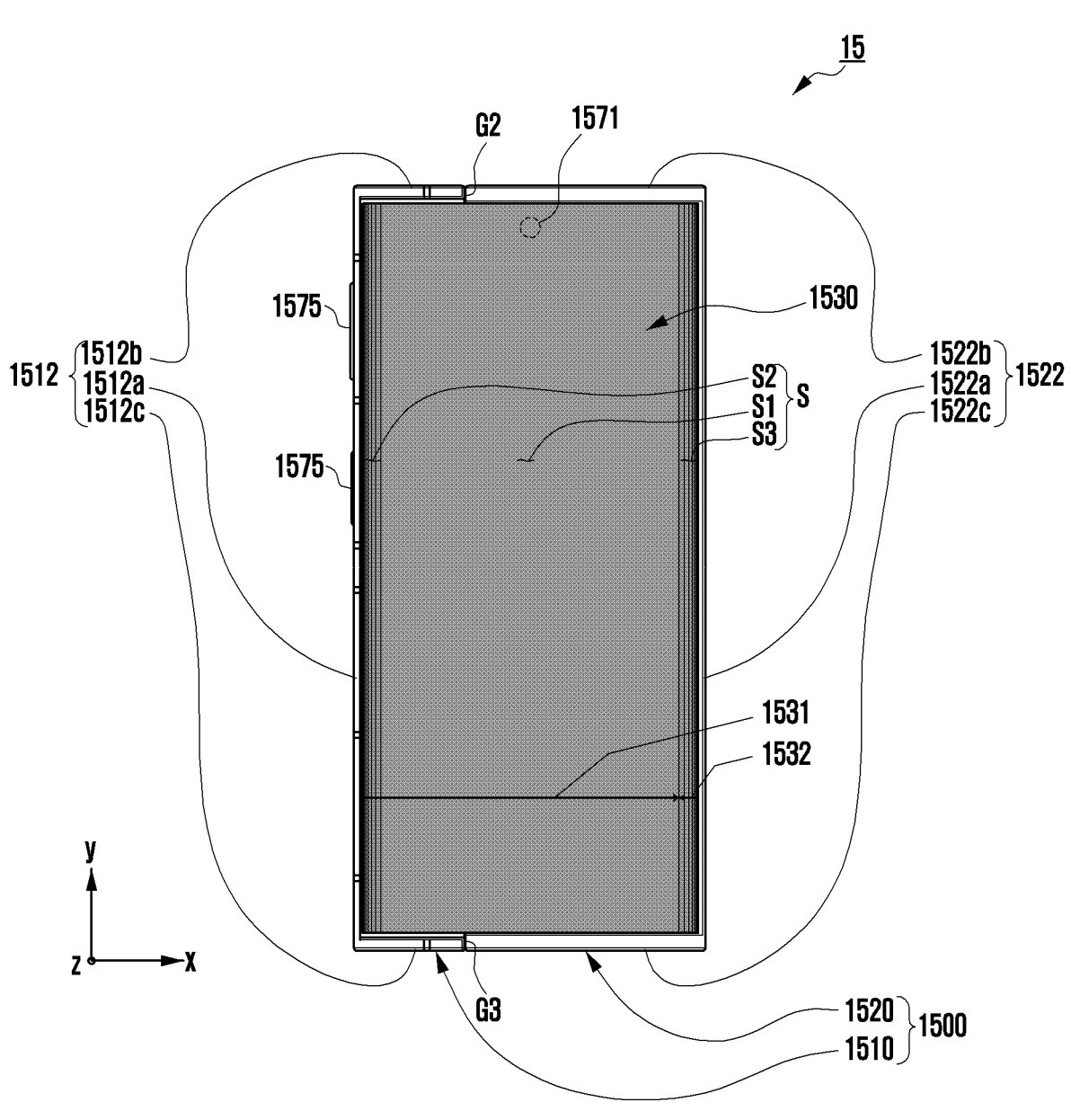
FIG. 15A is a front view of an electronic device in a closed state according to an embodiment of the disclosure.
Figure 15B:
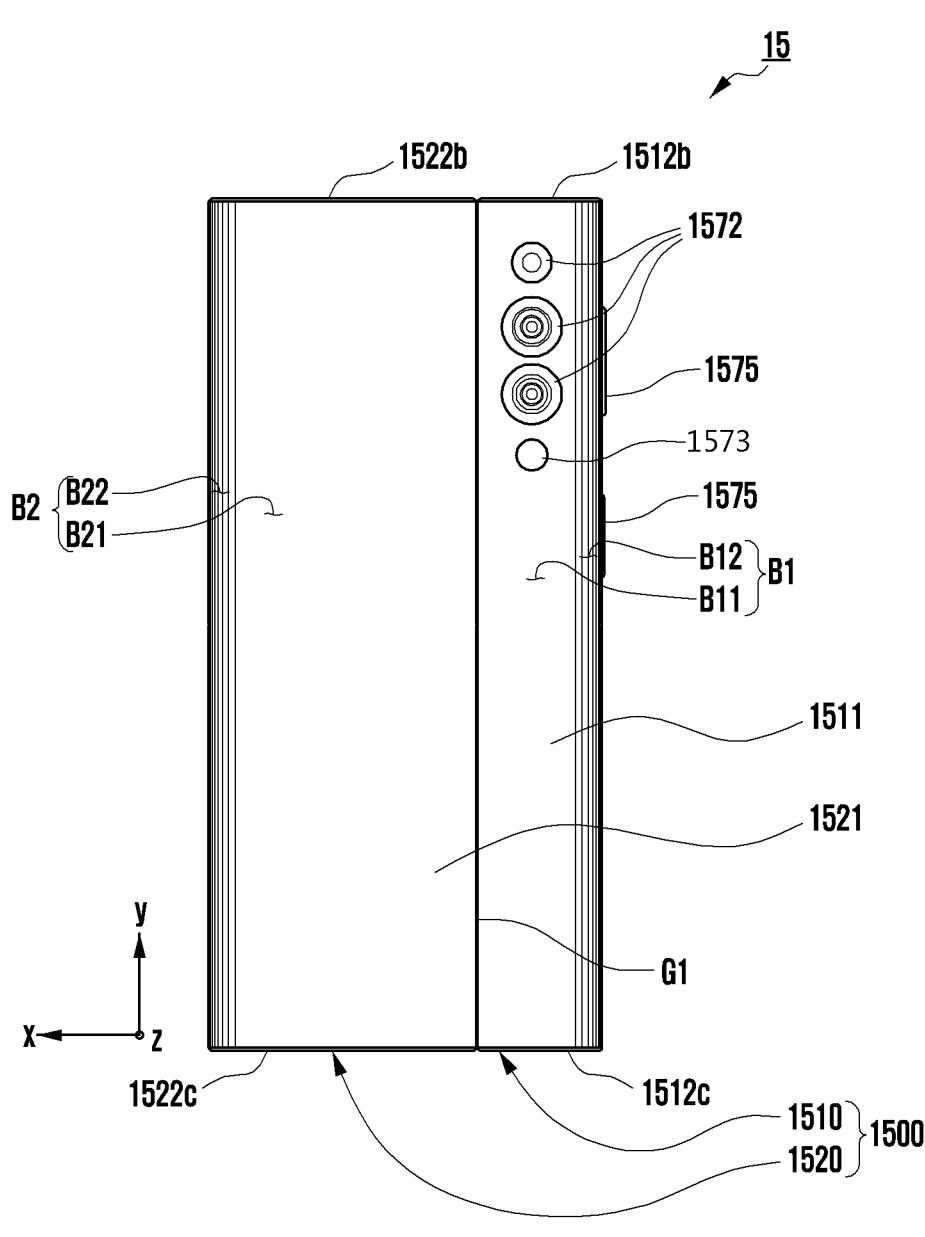
FIG. 15B is a rear view of an electronic device in a closed state according to an embodiment of the disclosure.
Figure 16A:
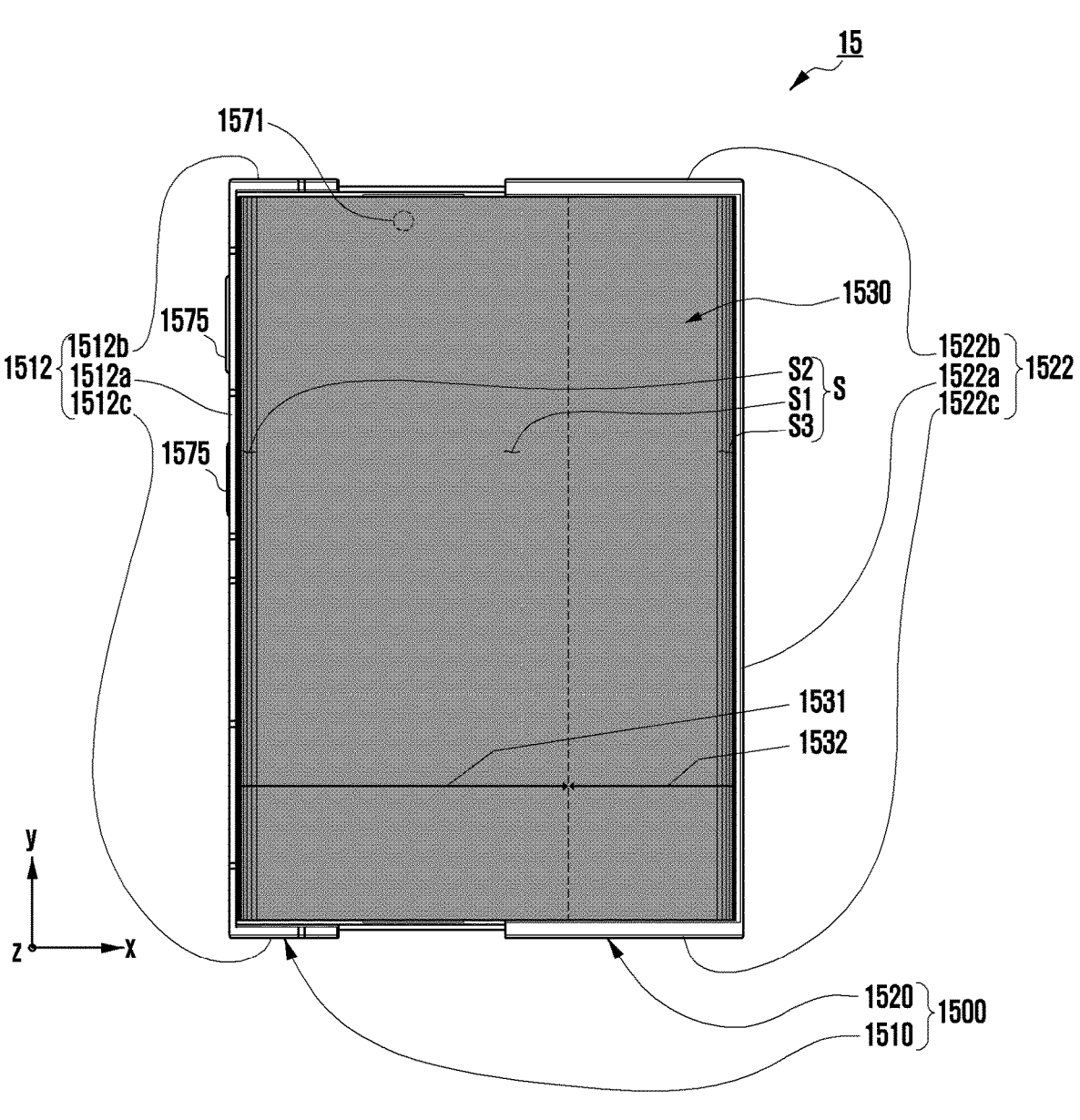
FIG. 16A is a front view of an electronic device in an open state according to an embodiment of the disclosure.
Figure 16B:
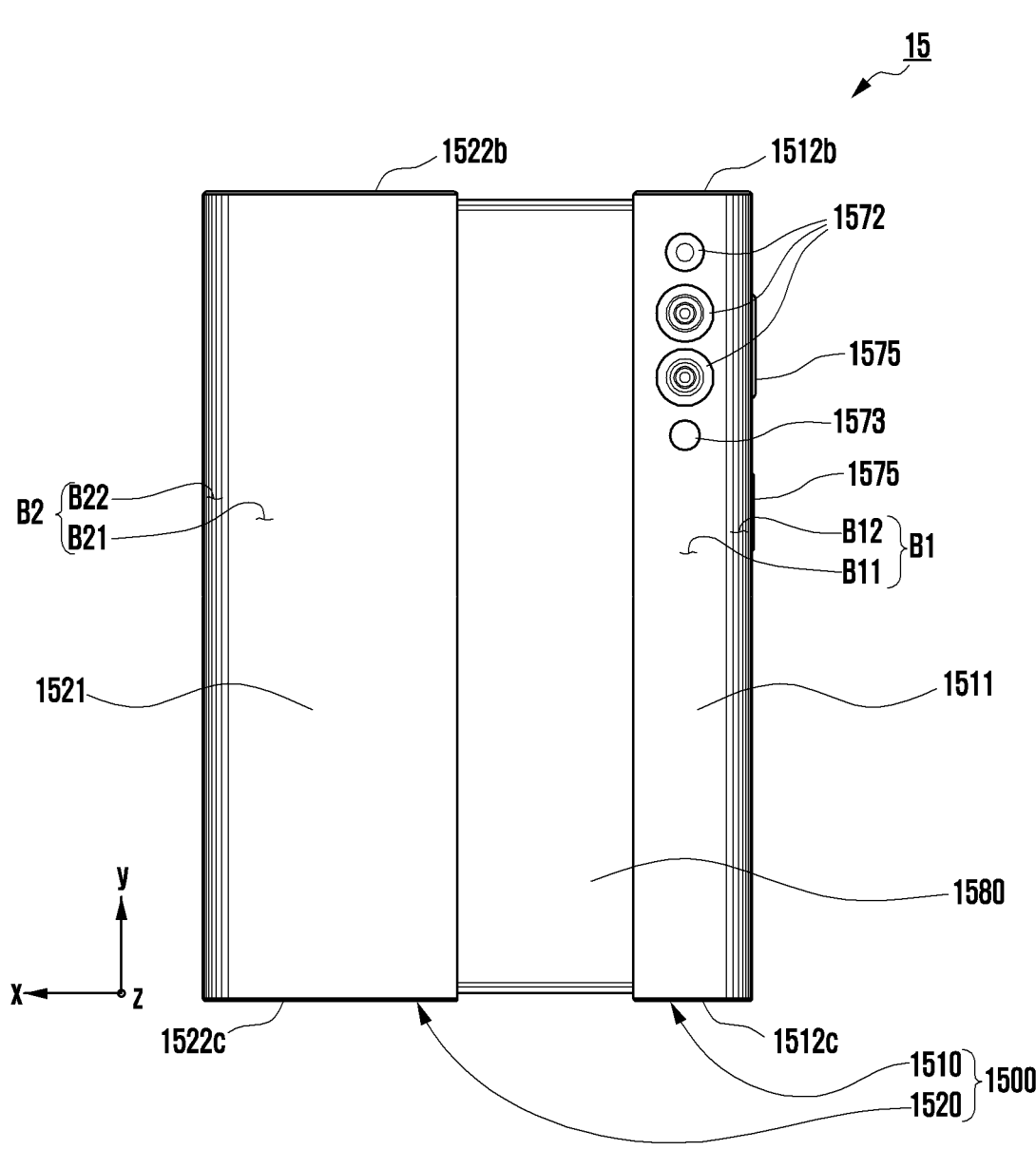
FIG. 16B is a rear view of an electronic device in an open state according to an embodiment of the disclosure.

FIG. 15A is a front view of an electronic device 15 in a closed state according to an embodiment of the disclosure. FIG. 15B is a rear view of an electronic device 15 in a closed state according to an embodiment of the disclosure. FIG. 16A is a front view of an electronic device 15 in an open state according to an embodiment of the disclosure. FIG. 16B is a rear view of an electronic device 15 in an open state according to an embodiment of the disclosure. In various embodiments of the disclosure, for the convenience of description, a surface oriented in a direction in which the screen thereof is visually exposed is interpreted and used as the front surface of the electronic device 15, and a surface oriented a direction opposite thereto is interpreted and used as the rear surface of the electronic device 15.

Referring to FIGS. 15A, 15B, 16A, and 16B, an electronic device 15 may include a housing (or a housing structure) 1500 and a flexible display 1530. The housing 1500 may include a first housing part (or a first housing structure) 1510 and a second housing part (or a second housing structure) 1520. The second housing part 1520 may be slidable relative to the first housing part 1510. A sliding structure for the sliding of the second housing part 1520 may be provided between the first housing part 1510 and the second housing part 1520. For example, the sliding structure may include a guide rail, and a slide or a roller which is guided by a guide rail and is moved. The sliding structure may be implemented in various other types. The flexible display 1530 may form a screen (or a display area) S which is visible to the outside of the electronic device 15. The flexible display 1530 may include a first area 1531 corresponding to the first housing part 1510, and a second area 1532 extending from the first area 1531 and corresponding to the second housing part 1520. At least a part of the second area 1532 may be withdrawn to the outside of the electronic device 15 or inserted into the inside of the electronic device 15 according to the sliding of the second housing part 1520, and thus the size of the screen S may be changed. The second area 1532 may be a portion of the flexible display 1530, which is bent in a state change (e.g., the switching between a closed state and an open state) of the electronic device 15, and for example, may be referred to as other terms, such as a "bendable area or a "bendable section". FIG. 15A illustrates the electronic device 15 in a state where the screen S is not expanded, and FIG. 16A illustrates the electronic device 15 in a state where the screen S is expanded. The state where the screen S is not expanded may be a state where the second housing part 1520 is not moved relative to the first housing part 1510 in a first direction (e.g., the +x-axis direction), and may be referred to as a closed state of the electronic device 15. The state where the screen S is expanded may be a state where the second housing part 1520 is no longer moved, that is, is maximally moved, in the first direction, and may be referred to as an open state of the electronic device 15. In some embodiments of the disclosure, an open state may include a fully open state (see FIG. 16A) or an intermediate state. The intermediate state may indicate a state between a closed state (see FIG. 15A) and a fully open state. In some embodiments of the disclosure, the case that the second housing part 1520 is at least partially moved relative to the first housing part 1510 in the first direction may be referred to as "a slide-out" of the second housing part 1520. In some embodiments of the disclosure, the case that the second housing part 1520 is at least partially moved relative to the first housing part 1510 in a second direction (e.g., the −x-axis direction) opposite to the first direction may be referred to as "a slide-in" of the second housing part 1520. Hereinafter, the first direction may also be referred to as a "slide-out direction", and the second direction may be referred to as a "slide-in direction". In the electronic device 15 having the screen S which is expandable in response to a slide-out of the second housing part 1520, the flexible display 1530 may also be referred to as other terms, such as an "expandable display" or a "slide-out display".

According to an embodiment of the disclosure, the screen S may include a first flat-surface part S1, a first curved-surface part S2, and/or a second curved-surface part S3. The first flat-surface part S1 may be positioned between the first curved-surface part S2 and the second curved-surface part S3. The first curved-surface part S2 and the second curved-surface part S3 may have a shape of being bent from the first flat-surface part S1 toward the rear surface (e.g., the surface positioned at the side opposite to the screen S) of the electronic device 15. The first curved-surface part S2 and the second curved-surface part S3 may be substantially symmetrical while having the first flat-surface part S1 interposed therebetween. The first flat-surface part S1 may be expanded or contracted according to a state change (e.g., the switching between a closed state and an open state) of the electronic device 15. The second curved-surface part S3 may be provided in a substantially identical shape even in a state change of the electronic device 15. The portion of the second area 1532 of the flexible display 1530, which forms the second curved-surface part S3, may change according to a state change of the electronic device 15. In a closed state or an open state of the electronic device 15, the first curved-surface part S2 may be positioned at the side opposite to the second curved-surface part S3, and thus may improve aesthetic impression of the screen S. According to some embodiments of the disclosure, the flat-surface part S1 may also be implemented in an expanded form without the first curved-surface part S2.

According to an embodiment of the disclosure, the first housing part 1510 may include a first back cover 1511 and a first side cover 1512. The first back cover 1511 may be positioned at the side opposite to the screen S. The first back cover 1511 may overlap a partial area of the screen S when seen from above the screen S (e.g., when seen in the −z-axis direction). The first side cover 1512 may partially surround the space between the first back cover 1511 and the screen S, and may form the side surface part of the electronic device 15. For example, the first side cover 1512 may include a first cover part 1512*a*, a second cover part 1512*b*, and/or a third cover part 1512*c*. The first cover part 1512*a* may be positioned at the side of the first curved-surface part S2 of the screen S. The second cover part 1512*b* may extend from one end of the first cover part 1512*a* in the slide-out direction (e.g., the +x-axis direction). The third cover part 1512*c* may extend from the other end of the first cover part 1512*a* in the slide-out direction. According to an embodiment of the disclosure, the first cover part 1512*a*, the second cover part 1512*b*, and the third cover part 1512*c* may be integrally formed, and may include the same material (e.g., metal (e.g., aluminum, stainless steel (STS), or magnesium) or polymer).

According to an embodiment of the disclosure, the second housing part 1520 may include a second back cover 1521 and a second side cover 1522. The second back cover 1521 may be positioned at the side opposite to the screen S. The second back cover 1521 may overlap a partial area of the screen S when seen from above the screen S. The second side cover 1522 may partially surround the space between the second back cover 1521 and the screen S, and may form the side surface part of the electronic device 15. For example, the second side cover 1522 may include a first cover part 1522*a* positioned at the side of the second curved-surface part S3 of the screen S, a second cover part 1522*b* extending from one end of the first cover part 1522*a* in the slide-in direction (e.g., the −x-axis direction), and/or a third cover part 1522*c* extending from the other end of the first cover part 1522*a* in the slide-in direction. According to an embodiment of the disclosure, the first cover part 1522*a*, the second cover part 1522*b*, and the third cover part 1522*c* of the second side cover 1522 may be integrally formed, and may include the same material (e.g., metal (e.g., aluminum, stainless steel (STS), or magnesium) or polymer). The first cover part 1512*a* of the first side cover 1512 and the first cover part 1522*a* of the second side cover 1522 may extend in a third direction (e.g., the y-axis direction), which is orthogonal to the slide-out direction (or the slide-in direction), to be substantially parallel to each other. The second cover part 1512*b* of the first side cover 1512 and the second cover part 1522*b* of the second side cover 1522 may be positioned at one edge side of the screen S. The third cover part 1512*c* of the first side cover 1512 and the third cover part 1522*c* of the second side cover 1522 may be positioned at the other edge side of the screen S. The housing 1500 may include a first boundary part G1 between the first housing part 1510 and the second housing part 1520 to correspond to the first back cover 1511 and the second back cover 1521. The housing 1500 may include a second boundary part G2 between the first housing part 1510 and the second housing part 1520 to correspond to the second cover part 1512*b* of the first side cover 1512 and the second cover part 1522*b* of the second side cover 1522. The housing 1500 may include a third boundary part G3 between the first housing part 1510 and the second housing part 1520 to correspond to the third cover part 1512*c* of the first side cover 1512 and the third cover part 1522*c* of the second side cover 1522. When seen from above the screen S (e.g., when seen in the −z-axis direction), the second boundary part G2 and the third boundary part G3 may be aligned in the third direction (e.g., the y-axis direction). In case that the electronic device 15 is switched from an open state to a closed state, the first boundary part G1, the second boundary part G2, and the third boundary part G3 may correspond to portions of the external of the electronic device 15, at which the first housing part 1510 and the second housing part 1520 substantially come into contact with each other.

According to an embodiment of the disclosure, the electronic device 15 may be coupled to the first housing part 1510, or may include a first support structure 1580 (see FIG. 16B) formed integrally with the first housing part 1510 at least partially. The first area 1531 of the flexible display 1530 may be coupled to the first support structure 1580. The electronic device 15 may include a second support structure (not shown) positioned in the second housing part 1520 to correspond to the second area 1532 of the flexible display 1530. In the slide-out of the second housing part 1520, due to the spatial positional relationship between the first support structure 1580 coupled to the first area 1531 and the second support structure corresponding to at least a part of the second area 1532, at least a part of the second area 1532 may be withdrawn to the outside through the interval between the first cover part 1522*a* and the second support structure. In the slide-in of the second housing part 1520, due to the spatial positional relationship between the first support structure 1580 coupled to the first area 1531 and the second support structure corresponding to at least a part of the second area 1532, at least a part of the second area 1532 may be inserted into the housing 1500 through the interval between the first cover part 1522a and the second support structure. For example, in the first support structure 1580, one surface coupled to the first area 1531 of the flexible display 1530 may include a flat-surface area and a curved-surface area. The flat-surface area of the first support structure 1580 may contribute to forming the first flat-surface part S1 of the screen S. The curved-surface area of the first support structure 1580 may contribute to forming the first curved-surface part S2 of the screen S. The second curved-surface part S3 of the screen S may be formed to correspond to the curved-surface part of the second support structure.

According to an embodiment of the disclosure, the first back cover 1511 may form a first rear surface B1 of the electronic device 15, and the second back cover 1521 may form a second rear surface B2 of the electronic device 15. For example, the first rear surface B1 may include a second flat-surface part B11 parallel to the first flat-surface part S1 of the screen S, and/or a third curved-surface part B12 bent from the second flat-surface part B11 toward the first curved-surface part S2 so as to correspond to the first curved-surface part S2 of the screen S. For example, the second rear surface B2 may include a third flat-surface part B21 parallel to the first flat-surface part S1 of the screen S, and/or a fourth curved-surface part B22 bent from the third flat-surface part B21 toward the second curved-surface part S3 so as to correspond to the second curved-surface part S3 of the screen S. The second flat-surface part B11 and the third flat-surface part B21 may be formed without a substantial height difference. In some embodiments of the disclosure, the second flat-surface part B11 may be implemented in an expanded from without the third curved-surface part B12, or the third flat-surface part B21 may be implemented in an expanded form without the fourth curved-surface part B22.

According to an embodiment of the disclosure, the first back cover 1511 and/or the second back cover 1521 may be opaque. For example, the first back cover 1511 and/or the second back cover 1521 may be formed of coated or colored glass, ceramic, polymer, metal (e.g., aluminum, stainless steel (STS), or magnesium), or a combination of at least two of the materials.

According to some embodiments of the disclosure, in the state (e.g., the closed state of the electronic device 15) where the second area 1532 of the flexible display 1530 is at least partially inserted in the inner space of the housing 1500, at least a part of the second area 1532 may be visible from the outside through the second rear surface B2. In this case, at least a partial area of the second back cover 1521 may be implemented to be transparent or translucent. In some embodiments of the disclosure, in case that there is a member positioned between the second back cover 1521 and at least a part of the second area 1532 in a closed state of the electronic device 15, at least a partial area of the member may include an opening or be formed transparently or translucently.

According to an embodiment of the disclosure, a sliding structure associated with the second housing part 1520 may include an elastic structure. For example, in case that the second housing part 1520 is moved by a predetermined distance by an external force, by the elastic structure included in the sliding structure, the electronic device may be switched from a closed state to an open state or from an open state to a closed state even without any further external force (e.g., semi-automatic slide operation). In some embodiments of the disclosure, in case that a signal is generated through an input device included in the electronic device 15, by a drive device, such as a motor connected to the second housing part 1520, the electronic device 15 may be switched from a closed state to an open state or from an open state to a closed state. For example, in case that a signal is generated through a hardware button or a software button provided through the screen S, the electronic device 15 may be switched from a closed state to an open state or from an open state to a closed state. In some embodiments of the disclosure, in case that signals are generated from various sensors, such as a pressure sensor, the electronic device 15 may be switched from a closed state to an open state or from an open state to a closed state.

According to an embodiment of the disclosure, the electronic device 15 may include a first camera module 1571, multiple second camera modules 1572, and/or a flash 1573. Each of the first camera module 1571 and/or the multiple second camera modules 1572 may include one lens or multiple lenses, an image sensor, and/or an image signal processor. For example, the flash 1573 may include a light-emitting diode or a xenon lamp.

For example, the first camera module 1571 (e.g., the camera module 180 in FIG. 1) may be aligned with an opening (e.g., a through-hole or a notch) formed through the screen S, and may be positioned inside the electronic device 15. External light may be introduced into the first camera module 1571 by passing through the opening and a partial area of the transparent cover overlapping the opening. The transparent cover may function to protect the flexible display 1530 from the outside, and for example, may include a flexible member, such as a plastic film (e.g., a polyimide film) or ultra-thin glass (UTG).

According to some embodiments of the disclosure, the first camera module 1571 may be disposed in at least a part of the lower end of the screen S, and may perform related functions (e.g., image photographing) while the position of the first camera module 1571 is not visually distinguished (exposed). For example, the first camera module 1571 may be positioned on the rear surface of the screen S, or below or beneath the screen S. The first camera module 1571 may be positioned to be aligned with a recess formed on the rear surface of the flexible display 1530. When seen from above the screen S (e.g., when seen in the −z-axis direction), the first camera module 1571 may be disposed to overlap at least a part of the screen S, and may obtain an image of an external subject without being exposed to the outside. In this case, a partial area of the flexible display 1530, which at least partially overlaps the first camera module 1571, may include a different pixel structure and/or wire structure compared to the other areas. For example, a partial area of the flexible display 1530, which at least partially overlaps the first camera module 1571, may have a different pixel density compared to other areas. A pixel structure and/or wire structure formed in a partial area of the flexible display 1530, which at least partially overlaps the first camera module 1571, may reduce the loss of light between the outside and the first camera module 1571. According to some embodiments of the disclosure, a pixel may also not be disposed in a partial area of the flexible display 1530, which at least partially overlaps the first camera module 1571.

For example, the multiple second camera modules 1572 (e.g., the camera module 180 in FIG. 1) and/or the flash 1573 may be positioned in the first housing part 1510 to correspond to the first rear surface B1 of the electronic device 15. The multiple second camera modules 1572 may have different attributes (e.g., angles of view) or functions, and for example, may include a dual camera or a triple camera. In some embodiments of the disclosure, the multiple second camera modules 1572 may include lenses having different angles of view, and the electronic device 15 may control to change a camera module, which is performed in the electronic device 15, based on a user selection. As another example, the multiple second camera modules 1572 may include at least one of a wide-angle camera, a telephoto camera, a color camera, a monochrome camera, or an infrared (IR) camera (e.g., a time of flight (TOF) camera or a structured light camera). For example, the IR camera may operate as at least a part of a sensor module (not shown) (e.g., the sensor module 176 in FIG. 1).

According to various embodiments (not shown), the electronic device 15 may include various sensor modules (e.g., the sensor module 176 in FIG. 1). The sensor modules may generate electrical signals or data values corresponding to an internal operation state of the electronic device 15 or an external environment state. For example, the sensor modules may include at least one of a proximity sensor, a gesture sensor, a gyro sensor, a barometric pressure sensor, a magnetic sensor, an acceleration sensor, a grip sensor, a color sensor, an infrared (IR) sensor, a biometric sensor (e.g., a fingerprint sensor, an HRM sensor), a temperature sensor, a humidity sensor, or an illuminance sensor. According to an embodiment of the disclosure, the sensor modules may include an optical sensor, and may be positioned inside the electronic device 15 while being aligned with an opening (e.g., a through-hole or a notch) formed through the flexible display 1530. In this case, external light may be introduced into the optical sensor by passing through the opening and a partial area of the transparent cover overlapping the opening.

In some embodiments of the disclosure, the sensor modules may be arranged in at least a part of the lower end of the screen S of the flexible display 1530, and may perform a related function while the positions of the sensor modules are not visually distinguished (exposed). For example, the sensor modules may be positioned on the rear surface of the screen S the flexible display 1530, or below or beneath the screen S of the flexible display 1530. The sensor modules may be positioned to be aligned with a recess formed on the rear surface of the flexible display 1530. When seen from above the screen S (e.g., when seen in the −z-axis direction), the sensor modules may be arranged to overlap at least a part of the screen S, and may perform a corresponding function while not being exposed to the outside. In this case, a partial area of the flexible display 1530, which at least partially overlaps the sensor modules, may include a different pixel structure and/or wire structure compared to other areas. For example, a partial area of the flexible display 1530, which at least partially overlaps the sensor modules, may have a different pixel density compared to other areas. A pixel structure and/or wire structure formed in a partial area of the flexible display 1530, which at least partially overlaps the sensor modules, may reduce the loss thereof in case that various types of signals (e.g., light or ultrasound) related to the sensor modules pass between the outside and the sensor modules. According to some embodiments of the disclosure, multiple pixels may not be arranged in a partial area of the flexible display 1530, which at least partially overlaps the sensor modules.

According to an embodiment of the disclosure, the electronic device 15 may include one or more key input devices 1575 (e.g., the input module 150 in FIG. 1). In some embodiments (not shown), the input modules may include at least one sensor module.

According to some embodiments of the disclosure, at least one of the elements of the electronic device 15 may be omitted, or other elements may be additionally included therein. For example, the electronic device 15 may include a microphone positioned inside the housing 1500, and a microphone hole formed through the housing 1500 to correspond thereto. According to some embodiments of the disclosure, the electronic device 15 may include multiple microphones capable of detecting the direction of sound. For example, the electronic device 15 may include a speaker positioned inside the housing 1500, and a speaker hole formed through the housing 1500 to correspond thereto. For example, the electronic device 15 may include a receiver for phone calling, which is positioned inside the housing 1500, and a receiver hole formed through the housing 1500 to correspond thereto. In some embodiments of the disclosure, the microphone hole and the speaker hole may be implemented as a single hole, or the speaker hole may be omitted, such as a piezo speaker. For example, the electronic device 15 may include a connector (e.g., a USB connector) (e.g., the connection terminal 178 in FIG. 1) positioned inside the housing 1500, and a connector hole formed through the housing 1500 to correspond thereto. The electronic device 15 may transmit and/or receive power and/or data to and/or from an external electronic device electrically connected to the connector through the connector hole. According to various embodiments of the disclosure, the electronic device 15 may be include the electronic device 101 in FIG. 1, or may include at least one of the elements of the electronic device 101 in FIG. 1.

According to an embodiment of the disclosure, the electronic device 15 may include a circuit board (e.g., the circuit board 6 in FIG. 6) including a flexible portion and a rigid portion, or portions having different flexibility. In order to help understand, an example in which the circuit board 6 in FIG. 6 is included in the electronic device 15 is presented, but does limit the scope of embodiments. Referring to FIGS. 6, 15A, 15B, 16A, and 16B, for example, the first connector 66 of the circuit board 6 may be electrically connected to an element positioned in the first housing part 1510, and the second connector 67 of the circuit board 6 may be electrically connected to an element positioned in the second housing part 1520. For another example, the first connector 66 of the circuit board 6 may be electrically connected to the flexible display 1530, and the second connector 67 of the circuit board 6 may be electrically connected to an element (e.g., a printed circuit board (e.g., PCB, or PBA)) positioned in the first housing part 1510 or the second housing part 1520. At least a part of the first portion 61 included in the circuit board 6 may be disposed in a shape corresponding to a state change (e.g., the switching between a closed state and an open state) of the electronic device 15. An electronic device having an expandable screen is not limited to the embodiment of FIG. 15A, and may be various. For example, in the state where a screen is reduced, the electronic device may be implemented such that the flexible display is disposed in the inner of the electronic device (or a housing) in a bent or rolled state. In this case, the flexible display may also be referred to as a rollable display.

In some embodiments of the disclosure, for example, an electronic device including a circuit board (e.g., the circuit board 6 in FIG. 6) including a flexible portion and a rigid portion, or portions having different flexibility may be implemented in various types, such as a slide type or swivel type electronic device, in which at least two or more housings (or housing parts) can perform a mutual motion (or mutual movement) (e.g., rotation or sliding). For example, the first connector 66 of the circuit board 6 (see FIG. 6) may be electrically connected to an element positioned in one housing, and the second connector 67 of the circuit board 6 may be electrically connected to an element positioned in the other housing. At least a part of the first portion 61 included in the circuit board 6 may be disposed in a shape corresponding to the spatial positional relationship between the two housings according to the mutual motion thereof. For example, the first portion 61 included in the circuit board 6 may be at least partially positioned in a connection part between the two housings, and the connection part (e.g., a mutual operation support part) may be implemented in various shapes related to the mutual motion between the two housings.

According to an embodiment of the disclosure, an electronic device (e.g., the electronic device 2 in FIG. 2) may include a housing (e.g., the foldable housing 20 in FIG. 2 or the housing 1500 in FIG. 15A). The housing may include a first housing part (e.g., the first housing part 210 in FIG. 2 or the first housing part 1510 in FIG. 15A), and a second housing part (e.g., the second housing part 220 in FIG. 2 or the second housing part 1520 in FIG. 15A) configured to be movable relative to the first housing part. The electronic device may include a circuit board (e.g., the circuit board 6 in FIG. 6) positioned in the housing. The circuit board may include a first portion (e.g., the first portion 61 in FIG. 6) bent in response to a movement of the second housing part, and a second portion (e.g., the second portion 62 in FIG. 6) which extend from the first portion and is more rigid than the first portion. The circuit board may include a lamination structure including a flexible non-conductive film (e.g., the first dielectric D1 in FIG. 7) extending from the first portion to the second portion, and at least one conductive pattern (e.g., the at least one first ground pattern G1 or the at least one second ground pattern G2 in FIG. 7) positioned on the flexible non-conductive film. The circuit board may include a coverlay (e.g., the first surface protective layer 710 in FIG. 7) extending from the first portion to the second portion. The coverlay may overlap the lamination structure and may include an electromagnetic shielding material (or an electromagnetic component, an electromagnetic shielding ingredient, an electromagnetic shielding constituent, an electromagnetic shielding characteristic, or an electromagnetic shielding property). The circuit board may include at least one conductive via (e.g., the at least one third conductive via V13 in FIG. 7) positioned in the second portion. The at least one conductive via may be configured to electrically connect the at least one conductive pattern and the coverlay.

According to an embodiment in the disclosure, the coverlay (e.g., the first surface protective layer 710 in FIG. 7) may extend into the second portion (e.g., the second portion 62 in FIG. 7).

According to an embodiment in the disclosure, the coverlay (e.g., the first surface protective layer 710 in FIG. 7) may include a first area (e.g., the first area 710*a* in FIG. 7) forming a part of the surface of the circuit board (e.g., the first surface 601 in FIG. 7), and a second area (e.g., the second area 710*b* in FIG. 7) extending from the first area into the second portion.

According to an embodiment in the disclosure, the coverlay (e.g., the first surface protective layer 710 in FIG. 7) may include a first insulation layer (e.g., the first insulation layer 712 in FIG. 7) forming a part (e.g., the first surface 601 in FIG. 7) of the surface of the circuit board, a second insulation layer (e.g., the second insulation layer 713 in FIG. 7) positioned between the first insulation layer and the lamination structure, and a the conductive layer (e.g., the seventh conductive layer 711 in FIG. 7) positioned between the first insulation layer and the second insulation layer. The at least one conductive via (e.g., the at least one third conductive via V13 in FIG. 7) may electrically connect the at least one conductive pattern (e.g., the at least one first ground pattern G1 or the at least one second ground pattern G2 in FIG. 7) and the conductive layer.

According to an embodiment in the disclosure, the coverlay (e.g., the first surface protective layer 710 in FIG. 7) may further include a non-conductive adhesive layer (e.g., the non-conductive adhesive layer 714 in FIG. 7) positioned between the second insulation layer (e.g., the second insulation layer 713 in FIG. 7) and the lamination structure.

According to an embodiment in the disclosure, the second insulation layer (e.g., the second insulation layer 713 in FIG. 7) may have a thickness greater than the conductive layer (e.g., the seventh conductive layer 711 in FIG. 7) or the first insulation layer (e.g., the first insulation layer 712 in FIG. 7).

According to an embodiment in the disclosure, the at least one conductive via (e.g., the at least one third conductive via V13 in FIG. 7) may include a laser via hole (LVH) or a stacked via.

According to an embodiment in the disclosure, the lamination structure may further include at least one another conductive pattern (e.g., the at least one first signal line pattern S1 in FIG. 7) physically separated from the at least one conductive pattern (e.g., the at least one first ground pattern G1 or the at least one second ground pattern G2 in FIG. 7). The circuit board may further include at least one another conductive via (e.g., the at least one first conductive via V11 in FIG. 7) positioned in the second portion (e.g., the second portion 62 in FIG. 7). The at least one another conductive via may be electrically connected to the at least one another conductive pattern.

According to an embodiment in the disclosure, the coverlay (e.g., the first surface protective layer 710 in FIG. 7) may be physically separated from the at least one another conductive via (e.g., the at least one first conductive via V11 in FIG. 7).

According to an embodiment in the disclosure, the coverlay (e.g., the first surface protective layer 1310 in FIG. 13) may further include a hole (e.g., the first hole H1 in FIG. 13) through which the at least one another conductive via (e.g., the at least one first conductive via V21 in FIG. 13) extends. The circuit board may further include a non-conductive member (e.g., the first non-conductive member 1391 in FIG. 13) positioned between the hole and the at least one another conductive via.

According to an embodiment in the disclosure, the at least one another conductive via (e.g., the at least one first conductive via V11 in FIG. 7) may include a plated through hole (PTH).

According to an embodiment in the disclosure, the second portion (e.g., the second portion 62 in FIG. 7) may have a thickness greater than the first portion (e.g., the first portion 61 in FIG. 7).

According to an embodiment in the disclosure, the second portion (e.g., the second portion 62 in FIG. 7) may protrude with respect to the first portion (e.g., the first portion 61 in FIG. 7).

According to an embodiment in the disclosure, the second portion (e.g., the second portion 62 in FIG. 7) may further include a rigid dielectric (e.g., the second dielectric D2 or the third dielectric D3 in FIG. 7) compared to the first portion (e.g., the first portion 61 in FIG. 7).

According to an embodiment in the disclosure, the circuit board may be configured to electrically connect a first electrical element positioned in the first housing part (e.g., the first housing part 210 in FIG. 2) and a second electrical element positioned in the second housing part (e.g., the second housing part 220 in FIG. 2). The first electrical element may include at least one antenna. The second electrical element may include a wireless communication circuit configured to transmit or receive a signal of a selected or a designated frequency band through the at least one antenna.

According to an embodiment in the disclosure, a circuit board (e.g., the circuit board 6 in FIG. 6) may include a first portion (e.g., the first portion 61 in FIG. 7), and a second portion (e.g., the second portion 62 in FIG. 7) which extends from the first portion and is more rigid than the first portion. The circuit board may include a lamination structure including a flexible non-conductive film (e.g., the first dielectric D1 in FIG. 7) extending from the first portion to the second portion, and at least one conductive pattern (e.g., the at least one first ground pattern G1 or the at least one second ground pattern G2 in FIG. 7) positioned on the flexible non-conductive film. The circuit board may include a coverlay (e.g., the first surface protective layer 710 in FIG. 7) extending from the first portion into the second portion. The coverlay may overlap the lamination structure and may include an electromagnetic shielding material (or an electromagnetic component, an electromagnetic shielding ingredient, an electromagnetic shielding constituent, an electromagnetic shielding characteristic, or an electromagnetic shielding property). The circuit board may include at least one conductive via (e.g., the at least one third conductive via V13 in FIG. 7) positioned in the second portion. The at least one conductive via may be configured to electrically connect the at least one conductive pattern and the coverlay.

According to an embodiment in the disclosure, the coverlay (e.g., the first surface protective layer 710 in FIG. 7) may include a first area (e.g., the first area 710a in FIG. 7) forming a part (e.g., the first surface 601 in FIG. 7) of the surface of the circuit board, and a second area (e.g., the second area 710b in FIG. 7) extending from the first area into the second portion (e.g., the second portion 62 in FIG. 7).

According to an embodiment in the disclosure, the coverlay (e.g., the first surface protective layer 710 in FIG. 7) may include a first insulation layer (e.g., the first insulation layer 712 in FIG. 7) forming a part (e.g., the first surface 601 in FIG. 7) of the surface of the circuit board, a second insulation layer (e.g., the second insulation layer 713 in FIG. 7) positioned between the first insulation layer and the lamination structure, a conductive layer (e.g., the seventh conductive layer 711 in FIG. 7) positioned between the first insulation layer and the second insulation layer, and a non-conductive adhesive layer (e.g., the non-conductive adhesive layer 714 in FIG. 7) positioned between the second insulation layer and the lamination structure. The at least one conductive via (e.g., the at least one third conductive via V13 in FIG. 7) may be configured to electrically connect the at least one conductive pattern (e.g., the at least one first ground pattern G1 or the at least one second ground pattern G2 in FIG. 7) and the conductive layer.

According to an embodiment in the disclosure, the lamination structure may further include at least one another conductive pattern (e.g., the at least one first signal line pattern S1 in FIG. 7) physically separated from the at least one conductive pattern (e.g., the at least one first ground pattern G1 or the at least one second ground pattern G2 in FIG. 7). The circuit board may further include at least one another conductive via (e.g., the at least one first conductive via V11 in FIG. 7) positioned in the second portion (e.g., the second portion 62 in FIG. 7). The at least one another conductive via may be electrically connected to the at least one another conductive pattern.

According to an embodiment in the disclosure, the coverlay (e.g., the first surface protective layer 1310 in FIG. 13) may further include a hole (e.g., the first hole H1 in FIG. 13) through which the at least one another conductive via (e.g., the at least one first conductive via V21 in FIG. 13) extends. The circuit board may further include a non-conductive member (e.g., the first non-conductive member 1391 in FIG. 13) positioned between the hole and the at least one another conductive via.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a housing comprising a first housing part and a second housing part configured to be movable relative to the first housing part; and
a circuit board which is positioned in the housing and comprises a first portion bent in response to a movement of the second housing part, and a second portion which extends from the first portion and is more rigid than the first portion,
wherein the circuit board comprises:
a flexible dielectric extending from the first portion to the second portion,
a first ground pattern extending from the first portion to the second portion and disposed on the flexible dielectric,
a second ground pattern positioned in the second portion,
a coverlay extending from the first portion to the second portion and comprising an electromagnetic shielding layer, a portion of the coverlay positioned between the first ground pattern and the second ground pattern at the second portion, and
a first conductive via positioned in the second portion and configured to electrically connect to the first ground pattern, the second ground pattern, and the coverlay,
a first signal line pattern extending from the first portion to the second portion, disposed on the flexible dielectric,
a second signal line pattern positioned in the second portion, and
a second conductive via positioned in the second portion and configured to electrically connect to the first signal line pattern and the second signal line pattern,
wherein the second conductive via is configured to penetrate the coverlay and to be electrically isolated from the electromagnetic shielding layer of the coverlay.

2. The electronic device of claim 1, wherein the portion of the coverlay is disposed inside the second portion.

3. The electronic device of claim 2, wherein another portion of the coverlay forms a part of a surface of the circuit board.

4. The electronic device of claim 1,
wherein the coverlay further comprises:
a first insulation layer extending from the first portion to the second portion, and forming a part of a surface of the circuit board, and a second insulation layer extending from the first portion to the second portion, and positioned between the first insulation layer and the flexible dielectric, and wherein the electromagnetic shielding layer is disposed between the first insulation layer and the second insulation layer, wherein the at least one first conductive via electrically connects the first ground pattern, the second ground pattern, and the conductive electromagnetic shielding layer of the coverlay.

5. The electronic device of claim 4, wherein the coverlay further comprises a non-conductive adhesive layer disposed on the second insulation layer, and wherein the second insulation layer is disposed between the electromagnetic shielding layer and the non-conductive adhesive layer.

6. The electronic device of claim 4, wherein the second insulation layer has a thickness greater than the electromagnetic shielding layer or the first insulation layer.

7. The electronic device of claim 1, wherein the at least one first conductive via comprises a laser via hole (LVH) or a stacked via.

8. The electronic device of claim 1, wherein the second conductive via is configured to penetrate the coverlay through a hole formed in the coverlay, and wherein the circuit board comprises a non-conductive member disposed between the second conductive via and an inner surface of the hole such that the second conductive via is physically and electrically separated from the coverlay.

9. The electronic device of claim 1, wherein the second conductive via comprises a plated through hole (PTH).

10. The electronic device of claim 1, wherein the second portion has a thickness greater than the first portion.

11. The electronic device of claim 1, wherein the second portion protrudes with respect to the first portion.

12. The electronic device of claim 1, wherein the second portion further comprises a rigid dielectric compared to the first portion.

13. The electronic device of claim 1, wherein the circuit board is configured to electrically connect a first electrical element positioned in the first housing part and a second electrical element positioned in the second housing part, wherein the first electrical element comprises at least one antenna, and wherein the second electrical element comprises a wireless communication circuit configured to transmit or receive a signal of a selected or a designated frequency band through the at least one antenna.

14. A circuit board comprising:

a first portion, and a second portion which extends from the first portion and is more rigid than the first portion;

a flexible dielectric extending from the first portion to the second portion, a first ground pattern extending from the first portion to the second portion and disposed on the flexible dielectric;

a second ground pattern positioned in the second portion;

a coverlay extending from the first portion into the second portion and comprising an electromagnetic shielding layer, a portion of the coverlay positioned between the first ground pattern and the second ground pattern at the second portion; and a first conductive via positioned in the second portion and configured to electrically connect to the first ground pattern, the second ground pattern, and the coverlay;

a first signal line pattern extending from the first portion to the second portion, disposed on the flexible dielectric;

a second signal line pattern positioned in the second portion; and a second conductive via positioned in the second portion and configured to electrically connect to the first signal line pattern and the second signal line pattern, wherein the second conductive via is configured to penetrate the coverlay and to be electrically isolated from the electromagnetic shielding of the coverlay.

15. The circuit board of claim 14, wherein another portion of the coverlay forms a part of a surface of the circuit board.

16. The circuit board of claim 14, wherein the coverlay further comprises;

a first insulation layer extending from the first portion to the second portion, and forming a part of a surface of the circuit board, and a second insulation layer extending from the first portion to the second portion, and positioned between the first insulation layer and the flexible dielectric, and wherein the electromagnetic shielding layer is disposed between the first insulation layer and the second insulation layer, wherein the at least one first conductive via electrically connects the first ground pattern, the second ground pattern, and the electromagnetic shielding layer.

17. The circuit board of claim 14, further comprising:

a non-conductive member disposed between the second conductive via and an inner surface of a hole formed in the coverlay such that the second conductive via is physically and electrically separated from the coverlay.

18. The circuit board of claim 14, wherein a first surface protective layer covers a first end of the at least one via and a second surface protective layer covers a second end of the at least one via.

* * * * *